United States Patent
Larson, III et al.

(10) Patent No.: US 6,987,433 B2
(45) Date of Patent: Jan. 17, 2006

(54) FILM ACOUSTICALLY-COUPLED TRANSFORMER WITH REVERSE C-AXIS PIEZOELECTRIC MATERIAL

(75) Inventors: John D. Larson, III, Palo Alto, CA (US); Yury Oshmyansky, Laguna Beach, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 43 days.

(21) Appl. No.: 10/836,653

(22) Filed: Apr. 29, 2004

(65) Prior Publication Data
US 2005/0093657 A1    May 5, 2005

Related U.S. Application Data

(63) Continuation-in-part of application No. 10/699,481, filed on Oct. 30, 2003.

(51) Int. Cl.
*H03H 9/205* (2006.01)
*H03H 9/54* (2006.01)
*H03H 9/60* (2006.01)

(52) U.S. Cl. ............... 333/189; 333/192; 29/25.35
(58) Field of Classification Search ........ 333/187–192; 29/25.35
See application file for complete search history.

(56) References Cited

U.S. PATENT DOCUMENTS

| | | | | |
|---|---|---|---|---|
| 3,174,122 A | * | 3/1965 | Fowler et al. | 333/189 |
| 3,189,851 A | * | 6/1965 | Fowler | 333/189 |
| 3,321,648 A | * | 5/1967 | Kolm | 310/321 |
| 3,422,371 A | * | 1/1969 | Newkirk et al. | 331/107 A |
| 3,568,108 A | * | 3/1971 | Poirier et al. | 333/187 |
| 5,587,620 A | | 12/1996 | Ruby et al. | 310/346 |
| 5,864,261 A | * | 1/1999 | Weber | 333/187 |

(Continued)

OTHER PUBLICATIONS

Reinhardt, Alexandre et al., Design of Coupled Resonator Filters using Admittance and Scattering Matrices IEEE Ultrasonics Symposium, vol. 1 of 2, Oct. 5, 2003, pp. 1428-1431.

Yang, C.-M, "Highly C-Axis-Oriented AlN Film using MOCVD for 5GHz-band FBAR Filter", IEEE Ultrasonics Symposium, Oct. 5, 2003, pp. 170-173.

Jung, Jun-Phil, "Experimental and Theoretical Investigation on the Relationship between AlN Properties and AlN-based FBAR Characteristics", IEEE International Frequency Control Symposium, May 4, 2003, pp. 779-784. * cited by examiner

*Primary Examiner*—Barbara Summons
(74) *Attorney, Agent, or Firm*—Ian Hardcastle

(57) ABSTRACT

An embodiment of the acoustically-coupled transformer has first and second stacked bulk acoustic resonators (SBARs) each having a stacked pair of film bulk acoustic resonators (FBARs) with an acoustic decoupler between the FBARs. Each FBAR has opposed planar electrodes with piezoelectric material between the electrodes. A first electrical circuit connects one FBARs of the first SBAR to one FBAR of the second SBAR, and a second electrical circuit connects the other FBAR of the first SBAR to the other FBAR of the second SBAR. The c-axis of the piezoelectric material of one of the FBARs is opposite in direction to the c-axes of the piezoelectric materials of the other three FBARs. This arrangement substantially reduces the amplitude of signal-frequency voltages across the acoustic decouplers and significantly improves the common mode rejection of the transformer. This arrangement also allows conductive acoustic decouplers to be used, increasing the available choice of acoustic decoupler materials.

32 Claims, 13 Drawing Sheets

U.S. PATENT DOCUMENTS

| | | | |
|---|---|---|---|
| 5,873,154 A * | 2/1999 | Ylilammi et al. | 29/25.35 |
| 6,107,721 A | 8/2000 | Lakin | 310/321 |
| 6,215,375 B1 | 4/2001 | Larson, III et al. | 333/187 |
| 6,262,637 B1 | 7/2001 | Bradley et al. | 333/133 |
| 6,278,342 B1 * | 8/2001 | Ella | 333/189 |
| 6,720,844 B1 * | 4/2004 | Lakin | 333/189 |
| 2003/0128081 A1 | 7/2003 | Ella et al. | 333/133 |

* cited by examiner * cited by examiner

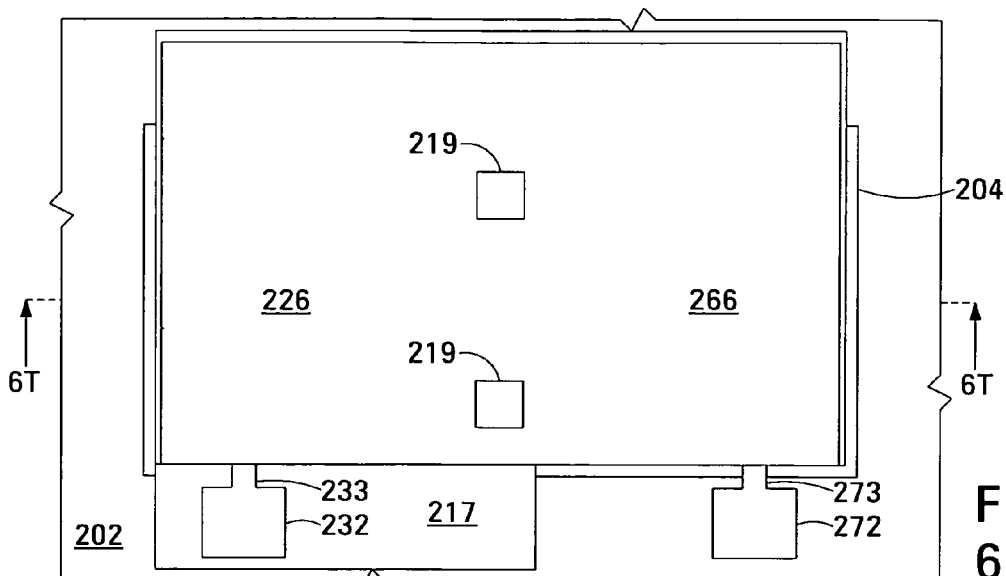
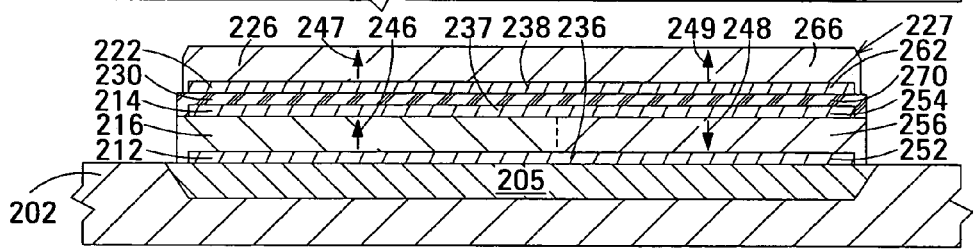
FIG. 6I
FIG. 6T
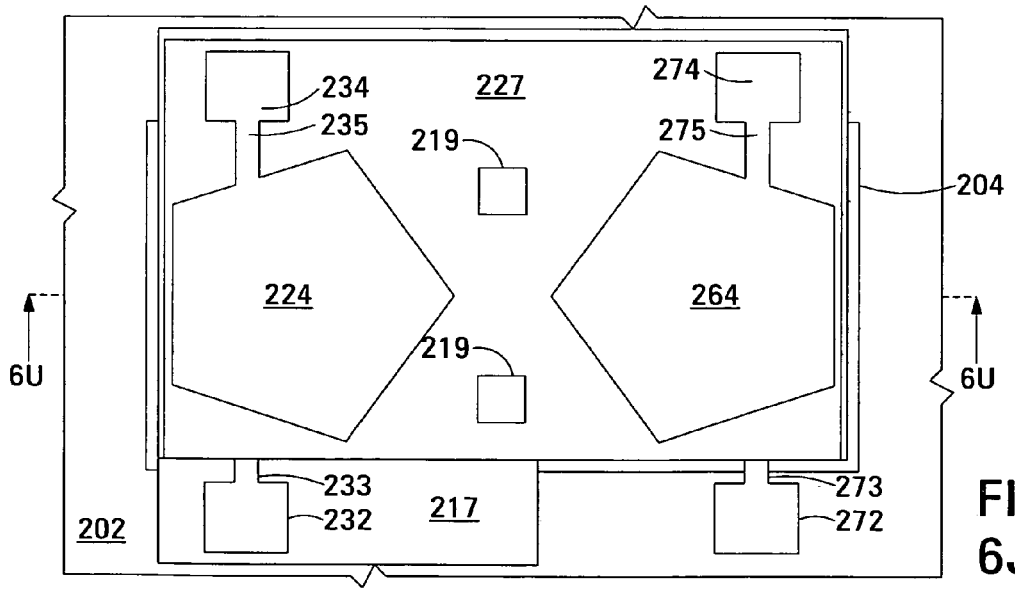
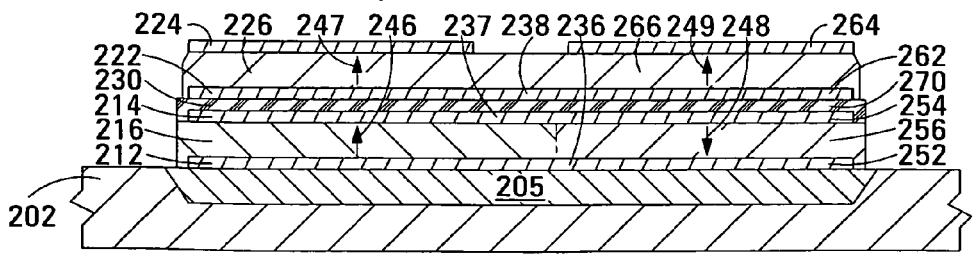
FIG. 6J
FIG. 6U

FILM ACOUSTICALLY-COUPLED TRANSFORMER WITH REVERSE C-AXIS PIEZOELECTRIC MATERIAL

RELATED APPLICATIONS

This application is a continuation-in-part of U.S. patent application Ser. No. 10/699,481 of Larson III et al. filed Oct. 30, 2003 and is related to U.S. patent application Ser. No. 10/836,663 of Larson III et al. entitled *Film Acoustically-Coupled Transformers with Two Reverse C-Axis Piezoelectric Elements* and filed on the filing date of this application, both of which applications are assigned to the assignee of this disclosure and are incorporated herein by reference.

BACKGROUND

Transformers are used in many types of electronic device to perform such functions as transforming impedances, linking single-ended circuitry with balanced circuitry or vice versa and providing electrical isolation. However, not all transformers have all of these properties. For example, an autotransformer does not provide electrical isolation.

Transformers operating at audio and radio frequencies up to VHF are commonly built as coupled primary and secondary windings around a high permeability core. Current in the windings generates a magnetic flux. The core contains the magnetic flux and increases the coupling between the windings. A transformer operable in this frequency range can also be realized using an optical-coupler. An opto-coupler used in this mode is referred to in the art as an opto-isolator.

In transformers based on coupled windings or opto-couplers, the input electrical signal is converted to a different form (i.e., a magnetic flux or photons) that interacts with an appropriate transforming structure (i.e., another winding or a light detector), and is re-constituted as an electrical signal at the output. For example, an opto-coupler converts an input electrical signal to photons using a light-emitting diode. The photons pass through an optical fiber or free space that provides isolation. A photodiode illuminated by the photons generates an output electrical signal from the photon stream. The output electrical signal is a replica of the input electrical signal At UHF and microwave frequencies, coil-based transformers become impractical due to such factors as losses in the core, losses in the windings, capacitance between the windings, and a difficulty to make them small enough to prevent wavelength-related problems. Transformers for such frequencies are based on quarter-wavelength transmission lines, e.g., Marchand type, series input/parallel output connected lines, etc. Transformers also exist that are based on micro-machined coupled coils sets and are small enough that wavelength effects are unimportant. However such transformers have issues with high insertion loss.

All the transformers just described for use at UHF and microwave frequencies have dimensions that make them less desirable for use in modern miniature, high-density applications such as cellular telephones. Such transformers also tend to be high in cost because they are not capable of being manufactured by a batch process and because they are essentially an off-chip solution. Moreover, although such transformers typically have a bandwidth that is acceptable for use in cellular telephones, they typically have an insertion loss greater than 1 dB, which is too high.

Opto-couplers are not used at UHF and microwave frequencies due to the junction capacitance of the input LED, non-linearities inherent in the photodetector, limited power handling capability and insufficient isolation to give good common mode rejection.

Above-mentioned U.S. patent application Ser. No. 10/699,481, of which this disclosure is a continuation-in-part, discloses a film acoustically-coupled transformer. FIG. 1A schematically illustrates an embodiment 100 of such acoustically-coupled transformer. Acoustically-coupled transformer 100 has a first stacked bulk acoustic resonator (SBAR) 106 and a second SBAR 108 located above a cavity 104 in a substrate 102. Each SBAR has a stacked pair of film bulk acoustic resonators (FBARs) and an acoustic decoupler between the FBARs. Specifically, SBAR 106 has a stacked pair of FBARs 110 and 120 and an acoustic coupler 130 between them, and SBAR 108 has a stacked pair of FBARs 150 and 160 and an acoustic coupler 170 between them. Each of the FBARs has opposed planar electrodes and a layer of piezoelectric material between the electrodes. For example, FBAR 110 has opposed planar electrodes 112 and 114 with a layer 116 of piezoelectric material between them.

Acoustically-coupled transformer 100 additionally has a first electrical circuit 141 connecting one of the FBARs of SBAR 106 to one of the FBARs of SBAR 108 and a second electrical circuit 142 connecting the other of the FBARs of SBAR 106 to the other of the FBARs of SBAR 108.

In the embodiment of the above-described acoustically-coupled transformer shown in FIG. 1A, electrical circuit 141 connects the respective FBARs in anti-parallel and electrical circuit 142 connects the respective FBARs in series. This embodiment has a 1:4 impedance transformation ratio between the electrical circuit 141 and electrical circuit 142 or a 4:1 impedance transformation ratio between electrical circuit 142 and electrical circuit 141.

In other embodiments, electrical circuit 141 electrically connects the one of the FBARs of SBAR 106 either in anti-parallel or in series with the one of the FBARs of SBAR 108, and electrical circuit 142 electrically connects the other of the FBARs of SBAR 106 either in anti-parallel or in series with the other of the FBARs of SBAR 108.

All embodiments of the above-described acoustically-coupled transformer are small in size, are capable of linking single-ended circuitry with balanced circuitry or vice versa, and provide electrical isolation between primary and secondary. The embodiments specifically described above are also nominally electrically balanced.

The embodiment shown in FIG. 1A is of particular interest for a number of applications. However, although this embodiment is nominally electrically balanced, its common mode rejection is less than many potential applications require. Moreover, the need to connect electrodes at different levels in the FBARs connected in anti-parallel increases the complexity of fabricating this embodiment of the transformer.

What is needed, therefore, is an acoustically-coupled transformer that has the advantages of the acoustically-coupled transformer described above, but that has better common mode rejection and is simpler to fabricate.

SUMMARY OF THE INVENTION

In a first aspect, the invention provides a thin-film acoustically-coupled transformer that has first and second stacked bulk acoustic resonators (SBARs), each having a stacked pair of film bulk acoustic resonators (FBARs) with an acoustic decoupler between the FBARs. Each FBAR has opposed planar electrodes with a layer of piezoelectric material between the electrodes. The piezoelectric material has a c-axis. A first electrical circuit connects one FBAR of the first SBAR to one FBAR of the second SBAR, and a second electrical circuit connects the other FBAR of the first SBAR to the other FBAR of the second SBAR. The c-axis of the piezoelectric material of one of the FBARs is opposite in direction to the c-axes of the piezoelectric materials of the other three FBARs. This arrangement substantially reduces the amplitude of signal-frequency voltages across the acoustic decouplers and significantly increases the common mode rejection ratio of the transformer. This arrangement also allows conductive acoustic decouplers to be used, increasing the available choice of acoustic decoupler materials.

In a second aspect, the invention provides a method of making a thin-film acoustically-coupled transformer in which a first stacked bulk acoustic resonator and a second stacked bulk acoustic resonator (SBAR) are fabricated. In fabricating the SBARs, a lower pair of film bulk acoustic resonators (FBARs), an upper pair FBARs and acoustic decouplers between the FBARs are formed. Each of the FBARs comprises opposed planar electrodes and a layer of piezoelectric material between the electrodes. The piezoelectric material has a c-axis. Forming the pairs of FBARs comprises setting the c-axis of the piezoelectric material of one of the FBARs opposite in direction to the c-axes of the piezoelectric material of the other three FBARs. Additionally, the method comprises electrically connecting one of the FBARs of the first SBAR to one of the FBARs of the second SBAR, and electrically connecting the other of the FBARs of the first SBAR to the other of the FBARs of the second SBAR.

In one embodiment, in forming the pairs of FBARs, a metal layer is deposited and is patterned to define a pair of the electrodes, and a layer of piezoelectric material is deposited over the electrodes. The c-axis of the piezoelectric material of one of the FBARs is set opposite in direction to the c-axes of the piezoelectric material of the other three FBARs by depositing a seed layer of reverse c-axis piezoelectric material on one of the electrodes prior to depositing the layer of piezoelectric material.

In another embodiment, in forming the pairs of FBARs, a metal layer is deposited and is patterned to define a pair of the electrodes, and a layer of piezoelectric material is deposited on the electrodes. The deposited layer comprises a region of reverse c-axis material on one of the electrodes and a region of normal c-axis material on the other of the electrodes. The c-axis of the piezoelectric material of one of the FBARs is set opposite in direction to the c-axes of the piezoelectric material of the other three FBARs by depositing the regions using different deposition conditions.

In another embodiment, in forming the pairs of FBARs, a metal layer is deposited and is patterned layer to define a pair of first electrodes, a layer of ferroelectric piezoelectric material is deposited over the first electrodes, and an additional metal layer is deposited and is patterned to define pair of second electrodes opposite the first electrodes. The c-axis of the piezoelectric material of one of the FBARs is set opposite in direction to the c-axes of the piezoelectric material of the other three FBARs by applying a poling voltage of a nominal polarity between one of the first electrodes and an opposed one of the second electrodes, and by applying a poling voltage of an opposite polarity between the other of the first electrodes and the other of the second electrodes.

BRIEF DESCRIPTION OF THE DRAWINGS

FIGS. 6A–6K are plan views illustrating an exemplary process for making a thin-film acoustically-coupled transformer in accordance with the invention.

FIGS. 6L–6V are cross-sectional views along the section lines 6L—6L, 6M—6M, 6N—6N, 6O—6O, 6P—6P, 6Q—6Q, 6R—6R, 6S—6S, 6T—6T, 6U—6U and 6V—6V in FIGS. 6A–6K, respectively.

DETAILED DESCRIPTION

Figure 1A:
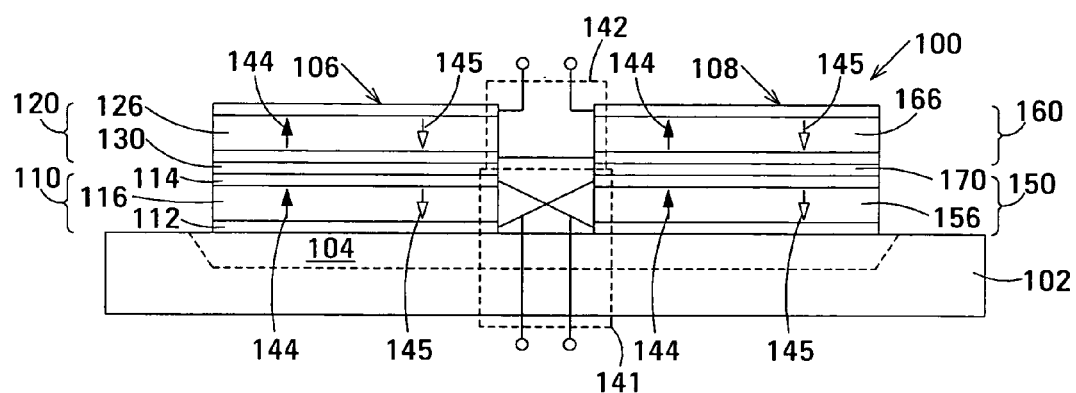
FIG. 1A is a schematic drawing of the electrical circuits of an embodiment of a 1:4 or 4:1 thin-film acoustically-coupled transformer in accordance with the prior art.

A film bulk acoustic resonator (FBAR) is a polarity-dependent device as a result of polarity dependence of the piezoelectric material that constitutes part of the FBAR. A voltage of a given polarity applied between the electrodes of the FBAR will cause the thickness of the FBAR to change in a first direction, whereas the same voltage of the opposite polarity will cause the thickness of the FBAR to change in a second direction, opposite the first direction. For example, a voltage of the given polarity will cause the thickness of the FBAR to increase whereas a voltage of the opposite polarity will cause the FBAR to decrease. The thickness of the FBAR is the dimension of the FBAR between the electrodes. Similarly, a mechanical stress applied to the FBAR that causes the thickness of the FBAR to change in a first direction will generate a voltage of the given polarity between the electrodes of the FBAR, whereas a mechanical stress that causes the thickness of the FBAR to change in a second direction, opposite the first direction, will generate a voltage of the opposite polarity between the electrodes of the FBAR. For example, a mechanical stress applied to the FBAR that causes the thickness of the FBAR to increase will generate a voltage of the given polarity, whereas a mechanical stress that causes the thickness of the FBAR to decrease will generate a voltage of the opposite polarity.

Piezoelectric materials, such as aluminum nitride (AlN), in the crystal class 6 mm have a hexagonal unit cell with an a-axis and a b-axis in the hexagonal plane and a c-axis orthogonal to the hexagonal plane. The direction of the c-axis of the piezoelectric material of the FBAR determines the relationship between the polarity of the voltage and the direction of change in the thickness of the FBAR. The above examples are obtained using an FBAR in which the piezoelectric material has its c-axis oriented in a given direction. In an FBAR in which the c-axis of the piezoelectric material is oriented in a second direction, opposite the first direction, a voltage of the given polarity applied between the electrodes of the FBAR will cause the thickness of the FBAR to change in the second direction, whereas a voltage of the opposite polarity will cause the thickness of the FBAR to change in a first direction. Similarly, a mechanical stress applied to the FBAR that causes the thickness of the FBAR to change in a first direction will generate a voltage of the opposite polarity between the electrodes of the FBAR whereas a mechanical stress that causes the thickness of the FBAR to change in a second direction, opposite the first direction, will generate a voltage of the given polarity between the electrodes of the FBAR. Piezoelectric material whose c-axis extends towards the substrate over which the FBAR is suspended will be referred to herein as reverse c-axis material. Piezoelectric material whose c-axis extends away from the substrate over which the FBARs are suspended will be referred to herein as normal c-axis material.

In the embodiments of the thin-film acoustically-coupled transformer described in above-mentioned U.S. patent application Ser. No. 10/699,481, such as the embodiment 100 shown in FIG. 1A, the respective piezoelectric layers 116, 126, 156 and 166 of FBARs 110, 120, 150 and 160 constituting transformer 100 are layers of normal c-axis material. The direction of the c-axis of normal c-axis material is indicated by an arrow 144. Alternatively, the respective piezoelectric layers 116 and 156 of lower FBARs 110 and 150 are layers of normal c-axis material and the respective piezoelectric layers 126 and 166 of upper FBARs 120 and 160 are layers of reverse c-axis material. The direction of the c-axis of reverse c-axis material is indicated by an arrow 145. In a further alternative, the respective piezoelectric layers 116 and 156 of lower FBARs 110 and 150 are layers of reverse c-axis material and the respective piezoelectric layers 126 and 166 of upper FBARs 120 and 160 are layers of normal c-axis material.

Figure 1B:
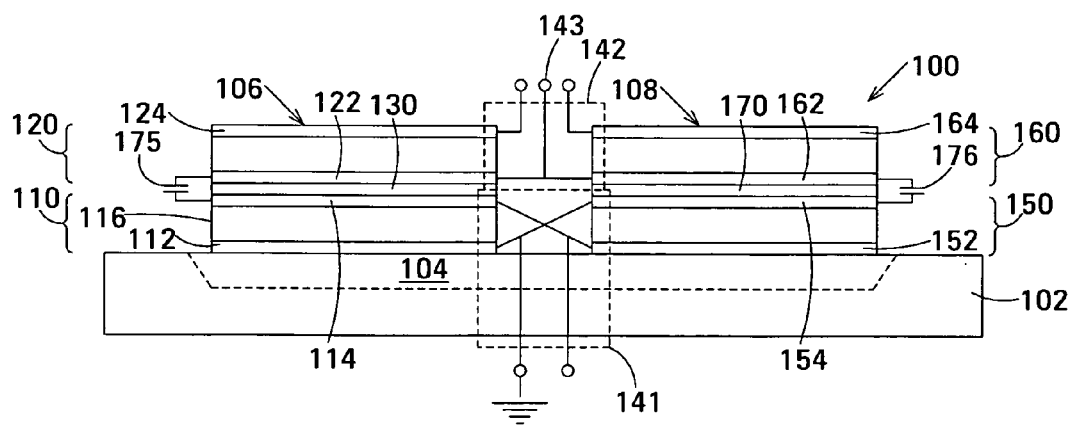
FIG. 1B is a schematic diagram showing parasitic capacitances in the thin-film acoustically-coupled transformer shown in FIG. 1A.

The inventors have discovered that in an acoustically-coupled transformer with the above-described c-axis orientations, a signal-frequency voltage difference exists between the electrodes on opposite sides of acoustic decouplers 130 and 170 during normal operation of the transformer. For example, as shown in FIG. 1B, when the embodiment shown in FIG. 1A is used in a typical application in which electrodes 112 and 154 are grounded and electrodes 122 and 162 are connected to a center tap terminal 143, a signal-frequency voltage difference exists between electrodes 114 and 122 on opposite sides of acoustic decoupler 130. When applied to the capacitor composed of electrodes 114 and 122 and acoustic decoupler 130, this voltage difference impairs the common mode rejection of transformer 100. The capacitance of this capacitor is shown schematically at 175. In some embodiments, a signal-frequency voltage difference additionally exists between electrodes 154 and 162 on opposite sides of acoustic decoupler 170. When applied to the capacitor composed of electrodes 154 and 162 and acoustic decoupler 170, this voltage difference further impairs the common mode rejection of transformer 100. The capacitance of this capacitor is shown schematically at 176.

The piezoelectric layer of one of the FBARs of the acoustically-coupled transformer in accordance with the invention has a c-axis opposite in direction to the c-axes of the piezoelectric layers of the remaining three FBARs. This allows the electrodes on opposite sides of the acoustic decouplers of both SBARs to be held at the same potential. The lack of a signal-frequency voltage difference across the capacitors formed by the acoustic decouplers and the adjacent electrodes renders the capacitance of capacitors irrelevant, and provides a concomitant improvement of the electrical properties of the transformer. Moreover, one of the FBARs having a piezoelectric layer with a c-axis opposite in direction to that of the remaining three FBARs eliminates the need for electrical connections between electrodes at different levels in the FBARs, which simplifies the fabrication of a transformer in accordance with the invention.

Figure 2A:
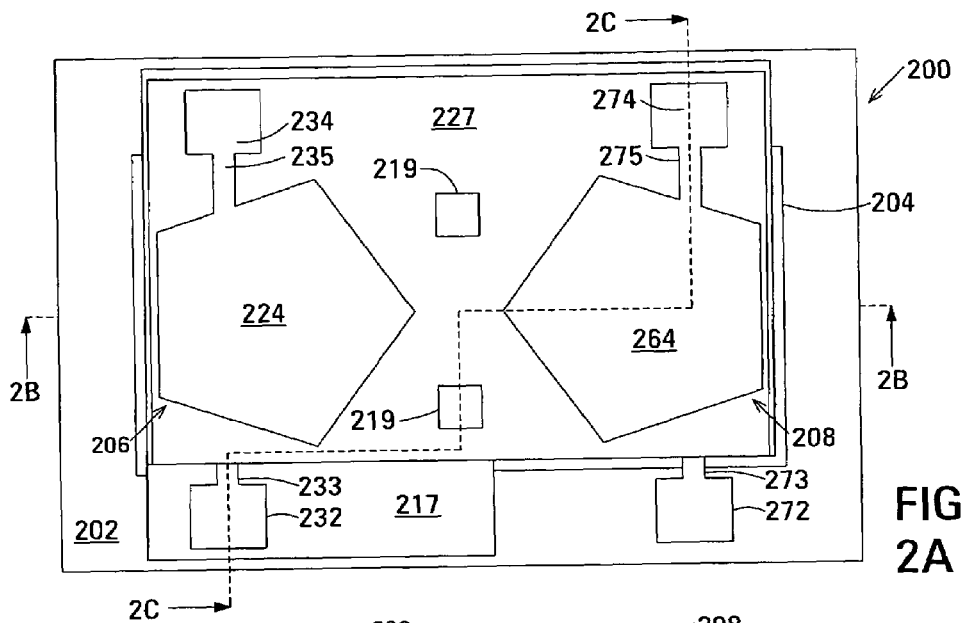
FIG. 2A is a plan view of an example of a first embodiment of a 1:4 or 4:1 thin-film acoustically-coupled transformer in accordance with the invention.
Figure 2B:
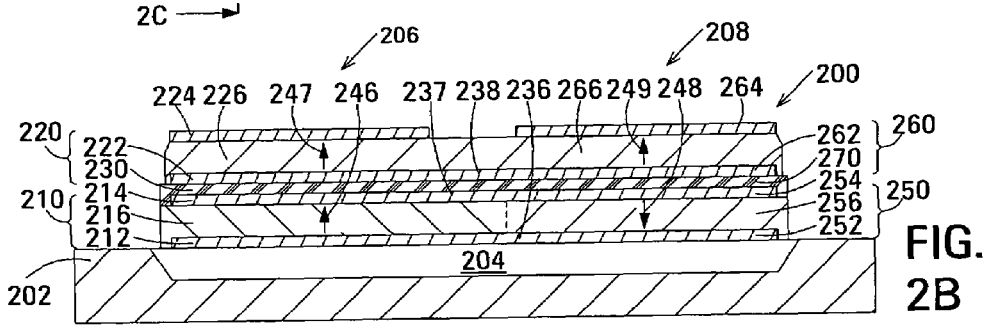
FIGS. 2B and 2C are cross-sectional views of the thin-film acoustically-coupled transformer along section lines 2B—2B and 2C—2C, respectively, in FIG. 2A.
Figure 2C:
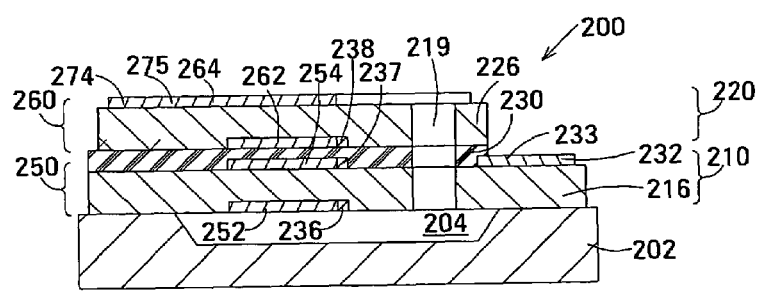

FIGS. 2A–2C show a plan view and two cross-sectional views, respectively, of an exemplary embodiment 200 of a thin-film acoustically-coupled transformer in accordance with the invention. Acoustically-coupled transformer 200 is capable of linking single-ended circuitry with balanced circuitry or vice versa, and has better common mode rejection than transformer 100 shown in FIG. 1A. The example shown additionally provides electrical isolation between primary and secondary. Acoustically-coupled transformer 200 has an impedance transformation ratio of 1:4 or 4:1 depending which of the electrical circuits is connected to the primary terminals of the transformer. Acoustically-coupled transformer 200 has a balanced secondary when connected as a 1:4 transformer or a balanced primary when connected as a 4:1 transformer.

Acoustically-coupled transformer 200 is composed of two stacked bulk acoustic resonators (SBARs) 206 and 208. Each SBAR is composed of a stacked pair of film bulk acoustic resonators (FBARs) and an acoustic decoupler between them. Transformer 200 is additionally composed of an electrical circuit that connects one of the FBARs of SBAR 206 to one of the FBARs of SBAR 208, and an electrical circuit that connects the other of the FBARs of SBAR 206 to the other of the FBARs of SBAR 208. SBARs incorporating acoustic decouplers are described in more detail in U.S. patent application Ser. No. 10/699,289 assigned to the assignee of this disclosure and incorporated herein in its entirety by reference.

SBAR 206 is composed of a stacked pair of FBARs 210 and 220 and an acoustic decoupler 230 between them. Acoustic decoupler 230 controls the coupling of acoustic energy between FBARs 210 and 220. SBAR 208 is composed of a stacked pair of FBARs 250 and 260 and an acoustic decoupler 270 between them. Acoustic decoupler 270 controls the coupling of acoustic energy between FBARs 250 and 260.

FBAR 220 is stacked atop FBAR 210 and FBAR 260 is stacked atop FBAR 250. FBAR 210 is composed of opposed planar electrodes 212 and 214 and a layer of piezoelectric material 216 between the electrodes. FBAR 220 is composed of opposed planar electrodes 222 and 224 and a layer of piezoelectric material 226 between the electrodes. FBAR 250 is composed of opposed planar electrodes 252 and 254 and a layer of piezoelectric material 256 between the electrodes. FBAR 260 is composed of opposed planar electrodes 262 and 264 and a layer of piezoelectric material 266 between the electrodes.

SBAR 206 and SBAR 208 are suspended over a cavity 204 defined in a substrate 202. Suspending the SBARs over a cavity allows the FBARs of the SBARs to resonate mechanically. Other suspension schemes that allow the FBARs to resonate mechanically are possible. For example, the SBARs can be located over a mismatched acoustic Bragg reflector (not shown) formed in or on substrate 202, as disclosed by Lakin in U.S. Pat. No. 6,107,721, the disclosure of which is incorporated into this disclosure by reference.

The piezoelectric layer of one of the FBARs is composed of piezoelectric material whose c-axis is opposite in direction from that of the piezoelectric layers of the remaining three FBARs. In the example shown, the piezoelectric material of piezoelectric layer 256 of FBAR 250 is reverse c-axis material. The direction of the c-axis of the reverse c-axis material of piezoelectric layer 256 is indicated by an arrow 248. The piezoelectric material of the piezoelectric layers 216, 226 and 266 of the three remaining FBARs 210, 220 and 260 is normal c-axis material. The direction of the c-axes of the normal c-axis material of piezoelectric layers 216, 226 and 266 is indicated by arrows 246, 247 and 249, respectively. In other embodiments, the piezoelectric material of the piezoelectric layer of any of one of the FBARs is reverse c-axis material and the piezoelectric material of the piezoelectric layers of the remaining three FBARs is normal c-axis material. Alternatively, the piezoelectric material of the piezoelectric layer of any of one of the FBARs is normal c-axis material and the piezoelectric material of the piezoelectric layers of the remaining three FBARs is reverse c-axis material.

Figure 3:
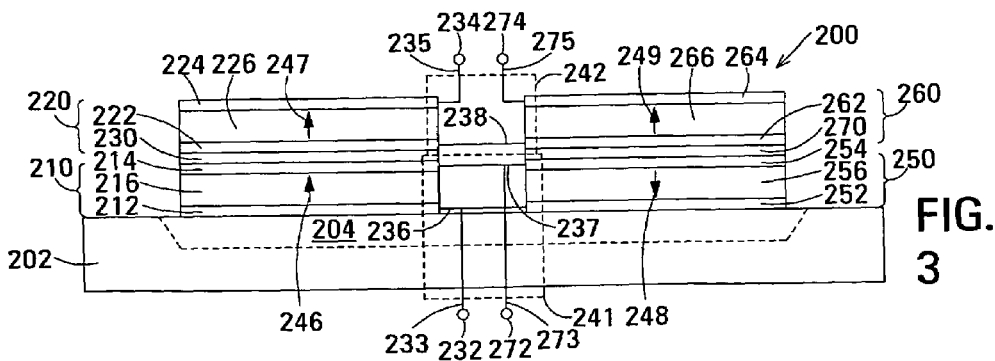
FIG. 3 is a schematic drawing of the electrical circuits of the thin-film acoustically-coupled transformer shown in FIG. 2A–2C.

FIG. 3 is a schematic drawing of the electrical circuits of acoustically-coupled transformer 200. A first electrical circuit 241 is composed of an electrical trace 236 that connects electrode 252 of FBAR 250 of SBAR 208 to electrode 212 of FBAR 210 of SBAR 206 and an electrical trace 237 that connects electrode 254 of FBAR 250 to electrode 214 of FBAR 210. Thus, electrical circuit 241 connects FBARs 210 and 250 in parallel. However, since the direction of the c-axis of piezoelectric layer 256 of FBAR 250 is reversed, FBARs 210 and 250 connected in parallel have the same electromechanical properties as conventional FBARs connected in anti-parallel. First electrical circuit 241 is additionally composed of an electrical trace 233 that electrically connects electrodes 212 and 252 to a terminal 232, and an electrical trace 273 that electrically connects electrodes 214 and 254 to a terminal 272. Terminals 232 and 272 are structured as bonding pads. The terms parallel and anti-parallel are described further below.

A second electrical circuit 242 is composed of an electrical trace 238 that electrically connects electrode 222 of FBAR 220 of SBAR 206 to electrode 262 of FBAR 260 of SBAR 208. Second electrical circuit 242 is additionally composed of an electrical trace 235 that electrically connects electrode 224 of FBAR 220 to a terminal 234, and an electrical trace 275 that electrically connects electrode 264 of FBAR 260 to a terminal 274. Since the directions of the c-axes of piezoelectric layers 226 and 266 of FBARs 220 and 260, respectively, are the same, electrical circuit 242 connects FBARs 220 and 260 in series. Terminals 234 and 274 are structured as bonding pads.

In an embodiment, terminals 232 and 272 constitute the primary terminals and the terminals 234 and 274 constitute the secondary terminals of thin-film acoustically-coupled transformer 200. So connected, acoustically-coupled transformer 200 operates as a step-up transformer. A signal applied to primary terminals 232 and 272 is output at twice the level at secondary terminals 234 and 274. Also, in a typical embodiment in which all of the FBARs 210, 220, 250 and 260 have a similar characteristic impedance, the impedance seen at primary terminals 232 and 272 is that of two FBARs in parallel, i.e., one half of the typical characteristic impedance of a single FBAR, whereas the impedance seen at secondary terminals 234 and 274 is that of two FBARs in series, i.e., twice the typical characteristic impedance of a single FBAR. Thus, acoustically-coupled transformer 200 has a 1:4 primary-to-secondary impedance ratio.

In an alternative embodiment, terminals 232 and 272 constitute the secondary terminals and terminals 234 and 274 constitute the primary terminals of thin-film acoustically-coupled transformer 200. So connected, acoustically-coupled transformer 200 operates as a step-down transformer. In this case, the signal output at secondary terminals 234 and 274 is one-half the level of the signal applied to primary terminals 232 and 272, and the primary-to-secondary impedance ratio is 4:1.

Electrical circuit 241 electrically connects FBARs 210 and 250 in parallel so that an input electrical signal applied to terminals 232 and 272 is applied equally and in phase to FBARs 210 and 250. An electrical signal applied to terminals 232 and 272 that causes FBAR 210 to contract mechanically causes FBAR 250 to expand mechanically by the same amount, and vice versa, due to the opposed directions of the c-axes of piezoelectric layers 216 and 256 of FBARs 210 and 250, respectively. The acoustic energy generated by FBAR 250 is therefore in antiphase with the acoustic energy generated by FBAR 210. Consequently, the acoustic energy received by FBAR 260 from FBAR 250 is in antiphase with the acoustic energy received by FBAR 220 from FBAR 210, and the signal on electrode 264 is in antiphase with the signal on electrode 224. Electrical circuit 242 connects FBARs 220 and 260 in series so that the voltage difference between terminals 234 and 274 is twice the voltage across either of FBARs 220 and 260.

Substantially the same capacitance exists between each of terminals 234 and 274 and substrate 202. Thus, circuit 242 of thin-film acoustically-coupled transformer 200 is electrically balanced. Moreover, in a typical application, terminal 272 is grounded and terminals 234 and 274 swing symmetrically about ground, so that the amplitude of any a.c. signal across acoustic decouplers 230 and 270 is small. The capacitance between the electrodes on opposite sides of the acoustic decouplers (similar to capacitances 175 and 176 shown in FIG. 1B) therefore has little effect on the electrical balance of circuit 242. Accordingly, transformer 200 has better common mode rejection than transformer 100 shown in FIG. 1A. Moreover, the lack of any a.c. signal across the acoustic decouplers allows electrically-conducting materials to be used in the acoustic decouplers.

FBARs are disclosed by Ruby et al. in U.S. Pat. No. 5,587,620 entitled *Tunable Thin Film Acoustic Resonators and Method of Making Same*, now assigned to the assignee of this disclosure and incorporated in this disclosure by reference. Ruby's disclosure also discloses a stacked film bulk acoustic resonator (SBAR) composed of two layers of piezoelectric material interleaved with three planar electrodes. Ruby's SBAR can be regarded as being composed of a stacked pair of FBARs in which the electrode between the piezoelectric layers is common to both FBARs, and will be referred to as a common-electrode SBAR. The common electrode renders the common-electrode SBAR incapable of providing the electrical isolation between primary and secondary that is desirable in some applications. Moreover, the common electrode SBAR exhibits an extremely narrow pass bandwidth that makes it unsuitable for use in most applications. The narrow pass bandwidth is the result of the common electrode, which over-couples acoustic energy between the FBARs.

As noted above, in transformer 200 in accordance with the invention, acoustic decoupler 230 controls the coupling of acoustic energy between stacked FBARs 210 and 220 and acoustic decoupler 270 controls the coupling of acoustic energy between stacked FBARs 250 and 260. Additionally, in embodiments in which acoustic decouplers, 230 and 270 are electrically insulating, acoustic decoupler 230 isolates FBAR 210 from FBAR 220, and acoustic decoupler 270 electrically isolates FBAR 250 from FBAR 260. In such embodiments, the electrical isolation provided by acoustic decouplers 230 and 270 provides electrical isolation between the primary and the secondary of transformer 200.

The acoustic coupling provided by acoustic decouplers 230 and 270 is substantially less than the acoustic coupling between the FBARs in the common electrode SBAR referred to above. As a result, FBARs 210 and 220 and FBARs 250 and 260 are not over coupled, and transformer 200 has a relatively flat response in the pass band, as will be described below with reference to FIG. 5.

The embodiment of the acoustic decouplers 230 and 270 shown in FIGS. 2A–2C is a first embodiment in which acoustic decoupler 230 is composed of layer of acoustic decoupling material located between the electrode 214 of FBAR 210 and the electrode 222 of FBAR 220, and acoustic decoupler 270 is composed of layer of acoustic decoupling material located between the electrode 254 of FBARs 250 and the electrode 262 of FBAR 260.

Figure 4A:
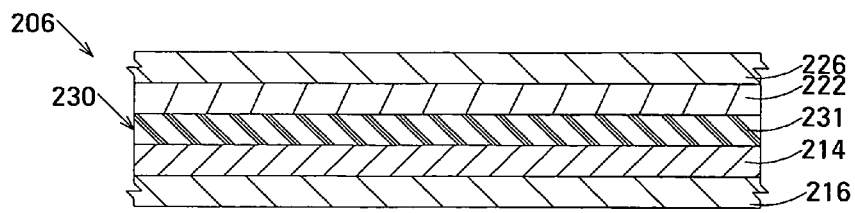
FIG. 4A is an enlarged cross-sectional view of part of the acoustically-coupled transformer shown in FIG. 2A along the section line 2B—2B showing a first embodiment of the acoustic decoupler.

FIG. 4A is an enlarged view showing in more detail part of SBAR 206 incorporating the above-mentioned first embodiment of acoustic decoupler 230. Referring additionally to FIGS. 2A and 2B, the corresponding part of SBAR 208 and acoustic decoupler 270 are similar in structure and will not be independently described. In the example shown, acoustic decoupler 230 is composed of a layer 231 of acoustic decoupling material located between the electrode 214 of FBAR 210 and electrode 222 of FBAR 220. Layer 231 of acoustic decoupling material additionally extends between the electrode 244 of FBAR 250 and electrode 262 of FBAR 260 to provide the acoustic decoupling layer 270 of SBAR 208. In other embodiments, independent but similar layers of acoustic decoupling material provide acoustic decouplers 230 and 270, respectively.

Important properties of the acoustic decoupling material of layer 231 are an acoustic impedance significantly different from, and typically significantly less than that of the materials of FBARs 210, 220, 250 and 260, and a nominal thickness that is an odd integral multiple of one quarter of the wavelength in the acoustic decoupling material of an acoustic wave having a frequency equal to the center frequency of the pass band of acoustically-coupled transformer 200. In some applications, a high electrical resistivity is also desirable. In embodiments in which the material of layer 231 is electrically insulating, a low dielectric permittivity is also desirable.

The acoustic decoupling material has an acoustic impedance less that of the materials of the FBARs 210, 220, 250 and 260 and substantially greater than that of air. The acoustic impedance of a material is the ratio of stress to particle velocity in the material and is measured in Rayleighs, abbreviated as rayl. The materials of the FBARs are typically aluminum nitride (AlN) as the material of piezoelectric layers 216, 226, 256 and 266 and molybdenum (Mo) as the material of electrodes 212, 214, 222, 224, 252, 254, 262 and 264. The acoustic impedances of the materials of the FBARs are typically greater than 30 Mrayl (35 Mrayl for AlN and 63 Mrayl for Mo) and the acoustic impedance of air is about 1 krayl. In embodiments of transformer 200 in which the materials of the FBARs are as stated above, materials with an acoustic impedance in the range from about 2 Mrayl to about 16 Mrayl work well as the acoustic coupling material of layer 231.

Figure 5:
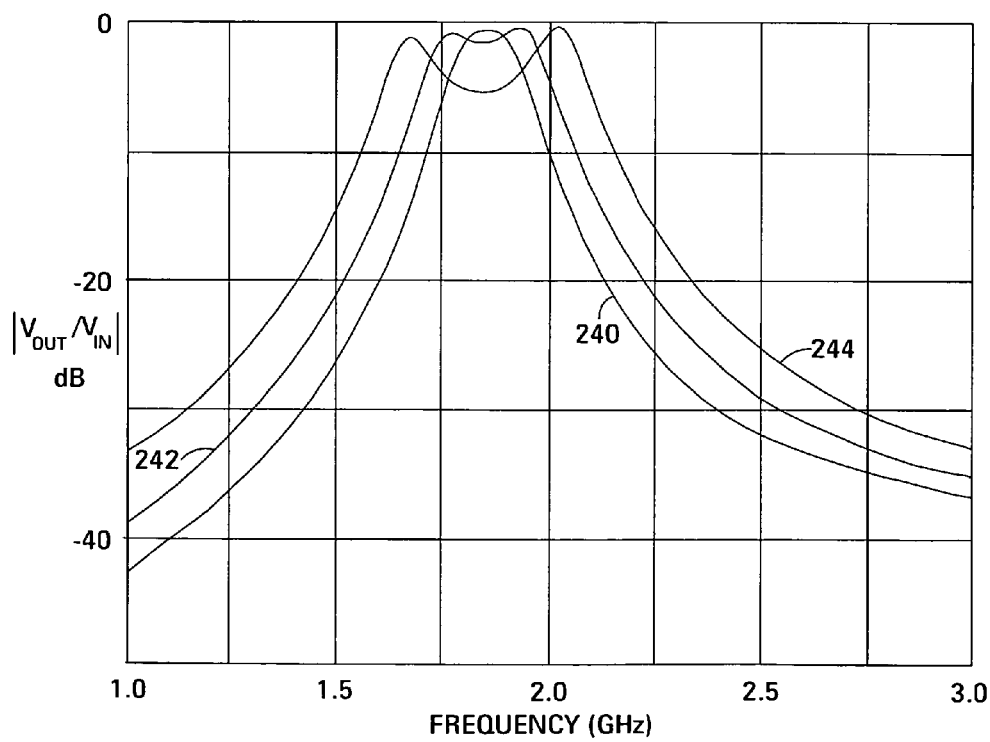
FIG. 5 is a graph showing how the calculated frequency response of embodiments of the thin-film acoustically-coupled transformer shown in FIGS. 2A–2C depends on the acoustic impedance of the acoustic decoupler.

FIG. 5 is a graph showing how the calculated frequency response of thin-film acoustically-coupled transformer 200 depends on the acoustic impedance of the acoustic decoupling material of layer 231 that constitutes the first embodiment of acoustic decouplers 230 and 270. The embodiment illustrated has a center frequency of about 1.9 GHz. Calculated frequency responses for embodiments in which the acoustic decoupling material of the acoustic decoupler has acoustic impedances of about 4 Mrayl (polyimide-curve 240), 8 Mrayl (curve 242) and 16 Mrayl (curve 244) are shown. It can be seen that the bandwidth of transformer 200 increases with increasing acoustic impedance of the acoustic decoupling material. In the embodiment in which the acoustic impedance is 16 Mrayl, the resonances of the FBARs are over coupled, which causes the characteristic double peak in the pass band response.

In the embodiment of thin-film acoustically-coupled transformer 200 shown in FIGS. 2A–2C, the thickness of the layer 231 (FIG. 4A) of acoustic decoupling material that constitutes acoustic decouplers 230 and 270 has a nominal thickness equal to one quarter of the wavelength in the acoustic decoupling material of an acoustic wave having a frequency equal to the center frequency of the transformer's pass band, i.e., $t \approx \lambda_n/4$, where t is the thickness of layer 231 and $\lambda_n$ is the wavelength in the acoustic decoupling material of an acoustic wave having a frequency equal to the center frequency of the pass band of transformer 200. A thickness of layer 231 within approximately ±10% of the nominal thickness can alternatively be used. A thickness outside this range can alternatively be used with some degradation in performance. However, the thickness of layer 231 should differ significantly from $0\lambda_n$, at one extreme and $\lambda_n/2$ at the other extreme.

More generally, layer 231 of acoustic decoupling material has a nominal thickness equal to an odd integral multiple of one quarter of the wavelength in the acoustic decoupling material of an acoustic wave having a frequency equal to the center frequency of the pass band of transformer 200, i.e., $t \approx (2m+1)\lambda_n/4$, where t and $\lambda_n$ are as defined above and m is an integer equal to or greater than zero. In this case, a thickness of layer 231 that differs from the nominal thickness by approximately ±10% of $\lambda_n/4$ can alternatively be used. A thickness tolerance outside this range can be used with some degradation in performance, but the thickness of layer 231 should differ significantly from an integral multiple of $\lambda_n/2$.

Many plastic materials have acoustic impedances in the range stated above and can be applied in layers of uniform thickness in the thickness ranges stated above. Such plastic materials are therefore potentially suitable for use as the acoustic decoupling material of layer 231 that constitutes acoustic decouplers 230 and 270. However, the acoustic decoupling material must also be capable of withstanding the temperatures of the fabrication operations performed after layer 231 has been deposited on electrodes 214 and 254 to form acoustic decouplers 230 and 270. As will be described in more detail below, in practical embodiments of thin-film acoustically-coupled transformer 200, electrodes 222, 224 262 and 264 and piezoelectric layers 226 and 266 are deposited by sputtering after layer 231 has been deposited. Temperatures as high as 300° C. are reached during these deposition processes. Thus, a plastic that remains stable at such temperatures is desirable as the acoustic decoupling material of layer 231.

Plastic materials typically have a very high acoustical attenuation per unit length compared with the other materials of SBARs 206 and 208. However, since the thickness of layer 231 of plastic acoustic decoupling material is typically less than 1 $\mu$m, the acoustic attenuation introduced by acoustic decouplers 230 and 270 is typically negligible.

In one embodiment, polyimide is used as the acoustic decoupling material of layer 231. Polyimide is sold under the trademark Kapton® by E. I. du Pont de Nemours and Company. In such embodiment, acoustic decouplers 230 and 270 are composed of layer 231 of polyimide applied to electrodes 214 and 254 by spin coating, spraying, dipping or another suitable method. Polyimide has an acoustic impedance of about 4 Mrayl. In another embodiment, a poly(para-xylylene) is used as the acoustic decoupling material of layer 231. In such embodiment, acoustic decouplers 230 and 270 are composed of layer 231 of poly(para-xylylene) applied to electrodes 214 and 254 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In an alternative embodiment, the acoustic decoupling material of layer 231 has an acoustic impedance substantially greater than the materials of FBARs 210, 220, 250 and 260. No materials having this property are known at this time, but such materials may become available in future, or lower acoustic impedance FBAR materials may become available in future. The thickness of layer 231 of such high acoustic impedance acoustic decoupling material is as described above.

In another alternative embodiment for use in applications in which DC isolation between primary and secondary is unimportant or in which an electrical connection between one side of the primary and a center tap of the secondary or an electrical connection between a center tap of the primary and one side of the secondary is desirable, the acoustic decoupling material of layer 231 constituting acoustic decouplers 230 and 270 is electrically conducting. In one embodiment, the acoustic decoupling material is a metal such as aluminum. In another embodiment, the acoustic decoupling material is a plastic material loaded with a metallic powder having a sufficient density to provide a conductive path between opposite sides of layer 231. For example, polyimide loaded with particles of carbon having a size in the range from about 1 nm to 10 nm is applied by spin coating or another suitable deposition process to form layer 231.

Figure 4B:
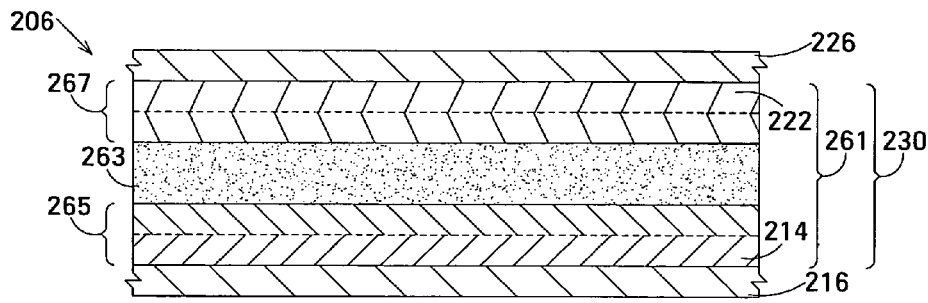
FIG. 4B is an enlarged cross-sectional view of part of the acoustically-coupled transformer shown in FIG. 2A along the section line 2B—2B showing a second embodiment of the acoustic decoupler.

FIG. 4B is an enlarged view showing in more detail part of SBAR 206 incorporating a second embodiment of acoustic decoupler 230 that incorporates a Bragg structure 261. The corresponding part of SBAR 208 incorporating such second embodiment of acoustic decoupler 270 is similar in structure and will not be independently described. Bragg structure 261 is composed of a low acoustic impedance Bragg element 263 sandwiched between high acoustic impedance Bragg elements 265 and 267. Low acoustic impedance Bragg element 263 is a layer of a low acoustic impedance material whereas high acoustic impedance Bragg elements 265 and 267 are each a layer of high acoustic impedance material. The acoustic impedances of the Bragg elements are characterized as "low" and "high" with respect to one another and additionally with respect to the acoustic impedance of the piezoelectric material of layers 216 and 226. In some embodiments, at least one of the Bragg elements additionally has a low dielectric permittivity. In some applications, at least one of the Bragg elements additionally has a high electrical resistivity to provide electrical insulation between primary and secondary.

Each of the layers constituting Bragg elements 261, 263 and 265 has a nominal thickness equal to an odd integral multiple of one quarter of the wavelength in the material of the layer of an acoustic wave having a frequency equal to the center frequency of transformer 200. Layers that differ from the nominal thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, low acoustic impedance Bragg element 263 is a layer of silicon dioxide ($SiO_2$), which has an acoustic impedance of about 13 Mrayl, and each of the high acoustic impedance Bragg elements 265 and 267 is a layer of the same material as electrodes 214 and 222, respectively, i.e., molybdenum, which has an acoustic impedance of about 63 Mrayl. Using the same material for high acoustic impedance Bragg elements 265 and 267 and electrodes 214 and 222, respectively, of FBARs 210 and 220, respectively, allows high acoustic impedance Bragg elements 265 and 267 additionally to serve as electrodes 214 and 222, respectively.

In an example, high acoustic impedance Bragg elements 265 and 267 have a nominal thickness equal to one quarter of the wavelength in molybdenum of an acoustic wave having a frequency equal to the center frequency of the pass band of transformer 200, and low acoustic impedance Bragg element 263 had a nominal thickness equal to three quarters of the wavelength in $SiO_2$ of an acoustic wave having a frequency equal to the center frequency of the pass band of the transformer. Using a three-quarter wavelength-thick layer of $SiO_2$ instead of a one-quarter wavelength thick layer of $SiO_2$ as low acoustic impedance Bragg element 263 reduces the capacitance between FBARs 210 and 220, but reduces the bandwidth of transformer 200.

In embodiments in which the acoustic impedance difference between high acoustic impedance Bragg elements 265 and 267 and low acoustic impedance Bragg element 263 is relatively low, Bragg structure 261 may be composed of more than one (e.g., n) low acoustic impedance Bragg element interleaved with a corresponding number (i.e., n+1) of high acoustic impedance Bragg elements. For example, the Bragg structure may be composed of two low acoustic impedance Bragg elements interleaved with three high acoustic impedance Bragg elements. Only one of the Bragg elements need be insulating.

In an embodiment, low acoustic impedance Bragg element 263 additionally extends between the electrodes 254 and 262 of SBAR 208 and provides parts of acoustic decouplers 230 and 270. Additionally, electrodes 254 and 262 have nominal thicknesses equal to one quarter of the wavelength in the electrode material of an acoustic wave having a frequency equal to the center frequency of the pass band of transformer 200. Alternatively, acoustic decouplers 230 and 270 may incorporate respective independent but similar low acoustic impedance Bragg elements.

Thousands of thin-film acoustically-coupled transformers similar to thin-film acoustically-coupled transformer 200 are fabricated at one time by wafer-scale fabrication. Such wafer-scale fabrication makes thin-film acoustically-coupled transformer 200 inexpensive to fabricate. An exemplary fabrication method will be described next with reference to the plan views of FIGS. 6A–3K and the cross-sectional views of FIGS. 6L–6V. The quantitative examples set forth below relate to an example of thin-film acoustically-coupled transformer 200 suitable for operation at a frequency of about 1.9 GHz. Examples suitable for operation at other frequencies will differ in such details as electrode areas and film thicknesses.

A wafer (not shown) of single-crystal silicon is provided. A portion of the wafer constitutes, for each transformer being fabricated, a substrate corresponding to the substrate 202 of transformer 200. FIGS. 6A–6K and FIGS. 6L–6V illustrate and the following description describes the fabrication of transformer 200 in and on a portion of the wafer. As transformer 200 is fabricated, the remaining transformers on the wafer are similarly fabricated.

Figure 6A:
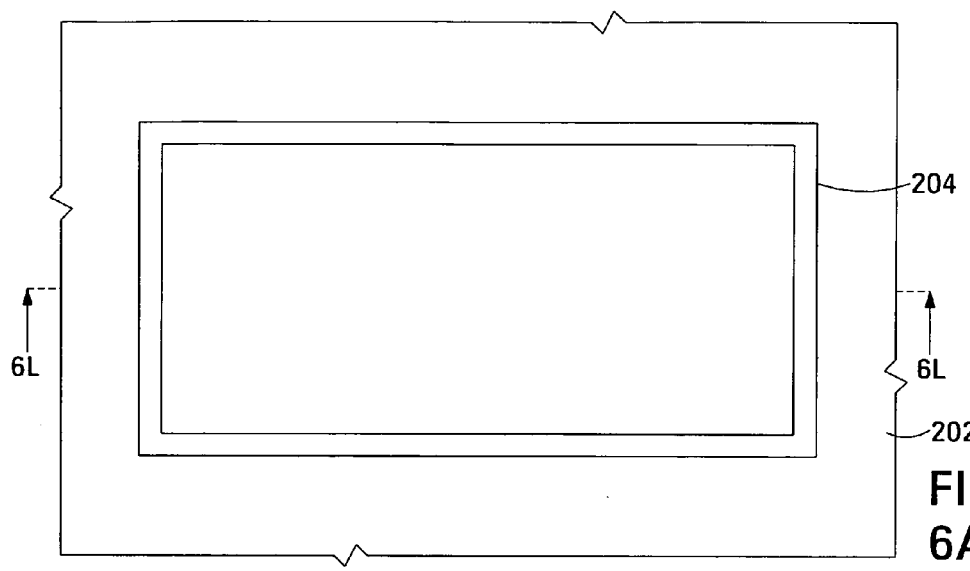
Figure 6L:
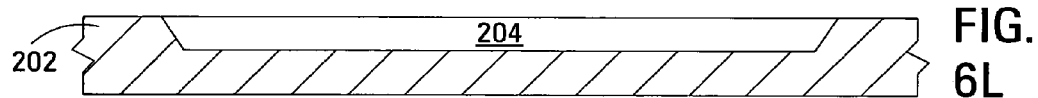

The portion of the wafer that constitutes substrate 202 of transformer 200 is selectively wet etched to form cavity 204, as shown in FIGS. 6A and 6L. Cavity 204 may alternatively be formed by dry etching.

Figure 6B:
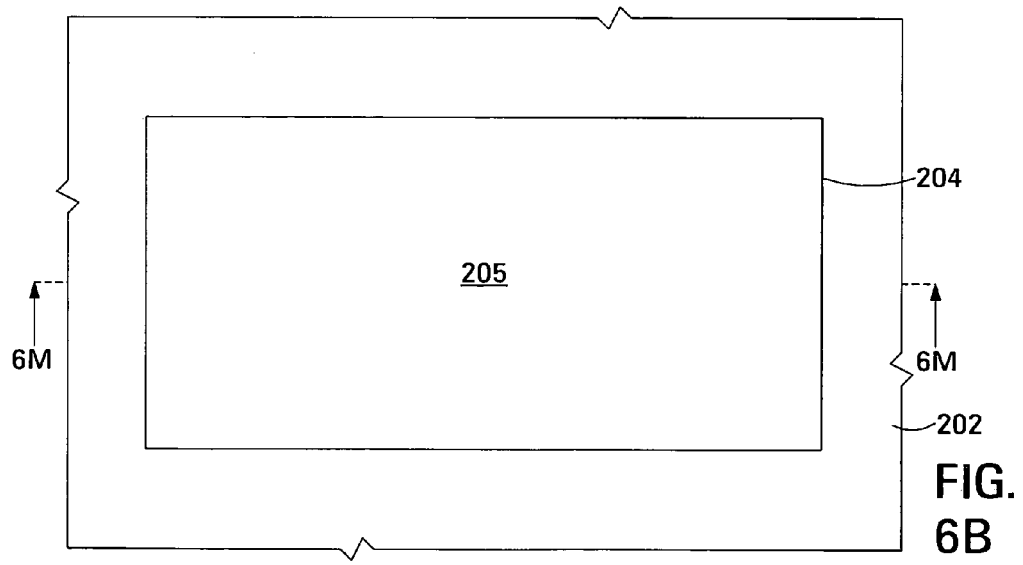
Figure 6M:
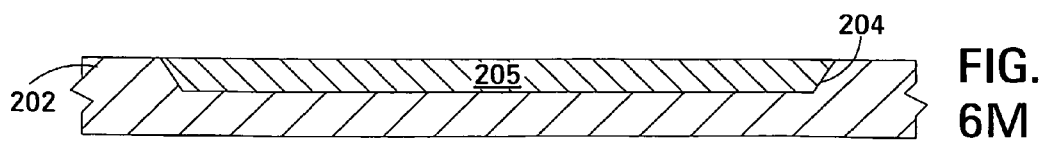

A layer of fill material (not shown) is deposited on the surface of the wafer with a thickness sufficient to fill the cavities. The surface of the wafer is then planarized to leave the cavity filled with the fill material. FIGS. 6B and 6M show cavity 204 in substrate 202 filled with fill material 205.

In an embodiment, the fill material was phosphosilicate glass (PSG) and was deposited using conventional low-pressure chemical vapor deposition (LPCVD). The fill material may alternatively be deposited by sputtering or by spin coating.

Figure 6C:
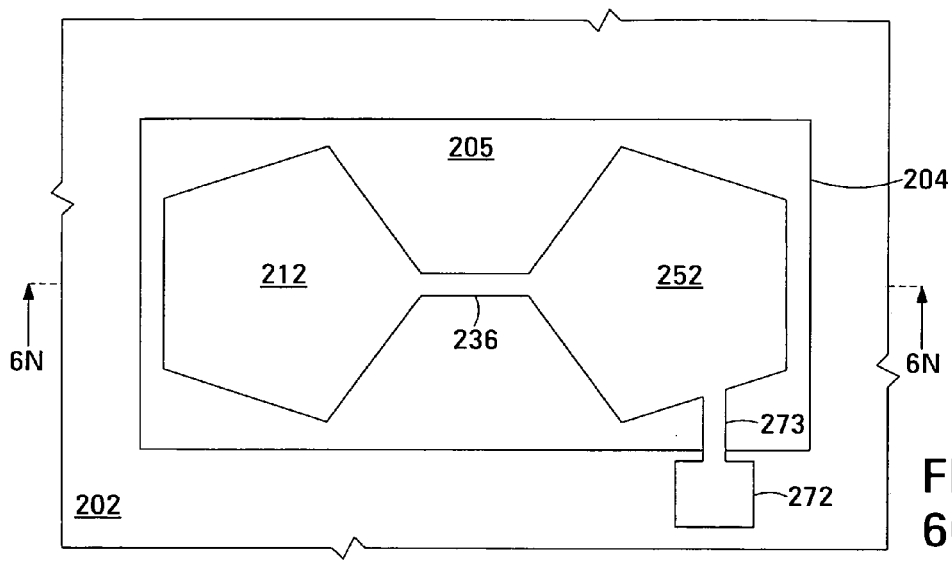
Figure 6N:
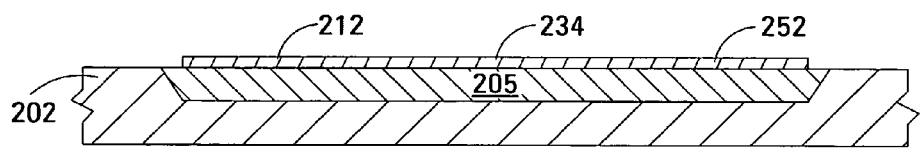

A layer of metal is deposited on the surface of the wafer and the fill material. The metal is patterned to define electrode 212, electrode 252, electrical trace 236 extending between electrodes 212 and 252, bonding pad 272 and electrical trace 273 extending between electrode 252 and bonding pad 272, as shown in FIGS. 6C and 6N. Electrode 212 and electrode 252 typically have an irregular shape in a plane parallel to the major surface of the wafer. An irregular shape minimizes lateral modes in the FBARs of which the electrodes form part, as described in U.S. Pat. No. 6,215,375 of Larson III et al., the disclosure of which is incorporated into this disclosure by reference. Electrode 212 and electrode 252 are located so that part of the surface of fill material 205 remains exposed to enable the fill material to be removed later by etching, as will be described below.

Electrodes 212, 214, 222, 224, 252, 254, 262 and 264 are formed by patterning metal layers such that, in respective planes parallel to the major surface of the wafer, electrodes 212 and 214 of FBAR 210 have the same shape, size, orientation and position, electrodes 222 and 224 of FBAR 220 have the same shape, size, orientation and position, electrodes 252 and 254 of FBAR 250 have the same shape, size, orientation and position and electrodes 262 and 264 of FBAR 260 have the same shape, size, orientation and position. Typically, electrodes 214 and 222 additionally have the same shape, size, orientation and position and electrodes 254 and 262 additionally have the same shape, size, orientation and position.

In an embodiment, the metal deposited to form electrode 212, electrode 252, trace 236, bonding pad 272 and trace 273 was molybdenum. The molybdenum was deposited with a thickness of about 440 nm by sputtering, and was patterned by dry etching to define pentagonal electrodes each with an area of about 7,000 square $\mu$m. The area of the electrodes is chosen to provide a given electrical impedance. The impedance also depends on the height of SBARs 206 and 208 and the operating frequency. Other refractory metals such as tungsten, niobium and titanium may alternatively be used as the material of electrodes 212 and 252, bonding pad 272 and traces 236 and 273. The electrodes, bonding pads and traces may alternatively comprise layers of more than one material.

Figure 6D:
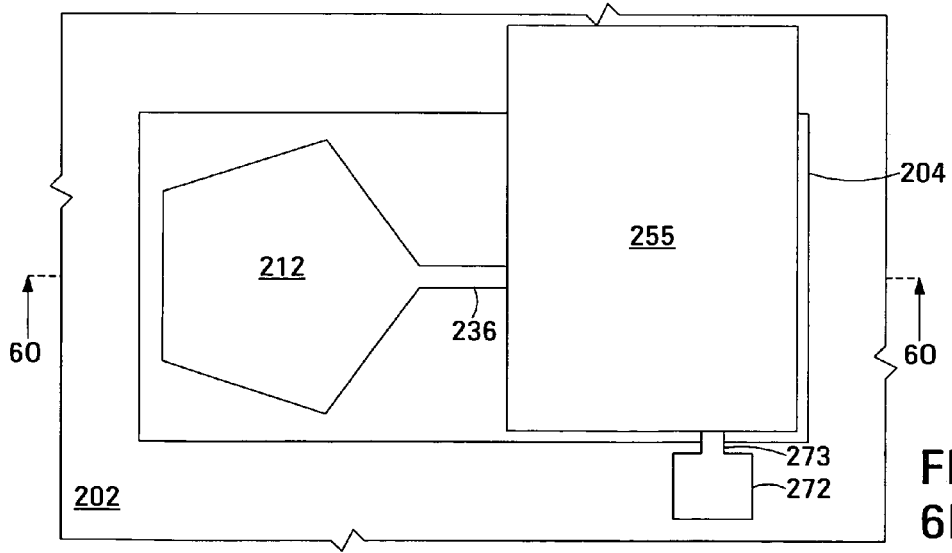
Figure 6O:
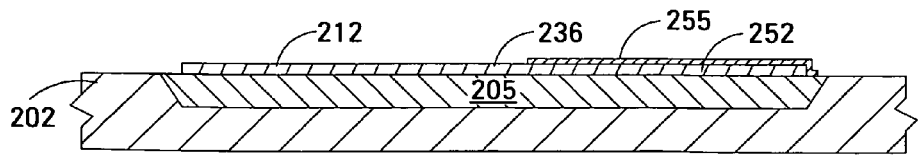
Figure 6E:
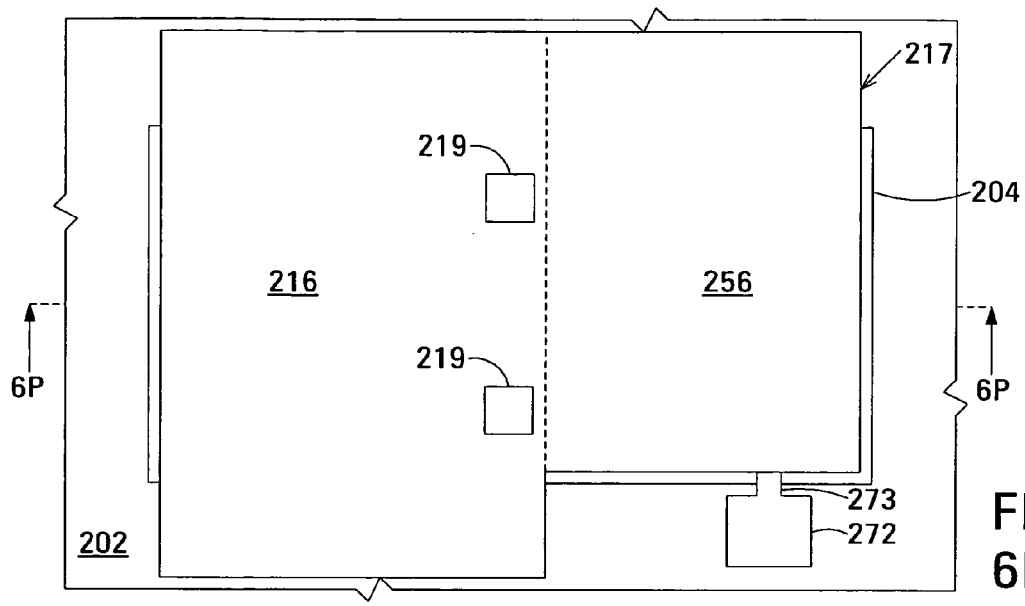
Figure 6P:
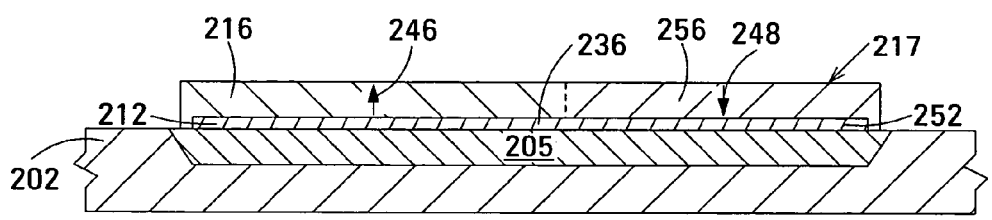

Piezoelectric material is deposited and is patterned to define a piezoelectric layer 217 that provides piezoelectric layer 216 of FBAR 210 and piezoelectric layer 256 of FBAR 250. The piezoelectric material is deposited by first depositing a thin layer of reverse c-axis piezoelectric material and patterning the thin layer to define seed layer 255 over electrode 252, as shown in FIGS. 6D and 6O. Then, a thick layer of piezoelectric material having a nominal thickness equal to the design thickness of piezoelectric layers 216 and 256 is deposited and is patterned to define piezoelectric layer 217, as shown in FIGS. 6E and 6P. Seed layer 255 remains in place under part of layer 217 but is not shown in FIG. 6P due to its negligible thickness compared with layer 217. Piezoelectric layer 217 is patterned to expose part of the surface of fill material 205 and bonding pads 232 and 272. Piezoelectric layer 217 is additionally patterned to define windows 219 that provide access to additional parts of the surface of the fill material.

Referring again to FIGS. 6D and 6N, the thin layer of piezoelectric material that is patterned to define seed layer 255 is deposited under deposition conditions that promote the formation of reverse c-axis piezoelectric material. Patterning the thin layer to define seed layer 255 exposes electrode 212, part of electrical trace 236, part of the surface of fill material 205, bonding pad 272 and part of electrical trace 273. Referring again to FIGS. 6E and 6O, the thick layer of piezoelectric material is deposited under normal deposition conditions. The piezoelectric material of the thick layer grows with the direction of its c-axis reversed in the portion deposited on seed layer 255 but with its c-axis in the normal direction elsewhere. The thick layer of piezoelectric material is patterned to define piezoelectric layer 217, which provides piezoelectric layer 216 and piezoelectric layer 256. The patterning exposes part of the surface of fill material 205, bonding pad 272 and part of electrical trace 273, and additionally forms windows 219 that provide access to additional parts of the surface of the fill material.

In an embodiment, the thin layer of piezoelectric material was aluminum nitride and was deposited with a thickness of about 40 nm by sputtering in an oxygen-rich sputtering environment. Although this deposition process could be used to deposit the entire thickness of piezoelectric layer 217, the resulting piezoelectric material typically has piezoelectric properties inferior to those of piezoelectric material grown under normal growth conditions. By depositing a thin layer of reverse c-axis material under oxygen-rich growth conditions as a seed layer, then depositing a thick layer of piezoelectric material under normal, nitrogen-rich growth conditions, the reverse c-axis piezoelectric material deposited on the seed layer has piezoelectric properties comparable with those of normal c-axis piezoelectric material. Thus, depositing layer 217 of piezoelectric material forms piezoelectric layer 216 with its c-axis (indicated by arrow 246) in the normal direction and piezoelectric layer 256 with its c-axis (indicated by arrow 248) in the reverse direction.

The thin layer of piezoelectric material was patterned to define seed layer 255 by wet etching in potassium hydroxide or by chlorine-based dry etching.

In an embodiment, the piezoelectric material deposited to form piezoelectric layer 217 was aluminum nitride and was deposited with a thickness of about 760 nm by sputtering. The piezoelectric material was patterned by wet etching in potassium hydroxide or by chlorine-based dry etching. Alternative materials for piezoelectric layer 217 include zinc oxide, cadmium sulfide and poled ferroelectric materials such as perovskite ferroelectric materials, including lead zirconium titanate, lead meta niobate and barium titanate. Poling of ferroelectric materials is described below with reference to FIGS. 8A–8F.

Figure 6F:
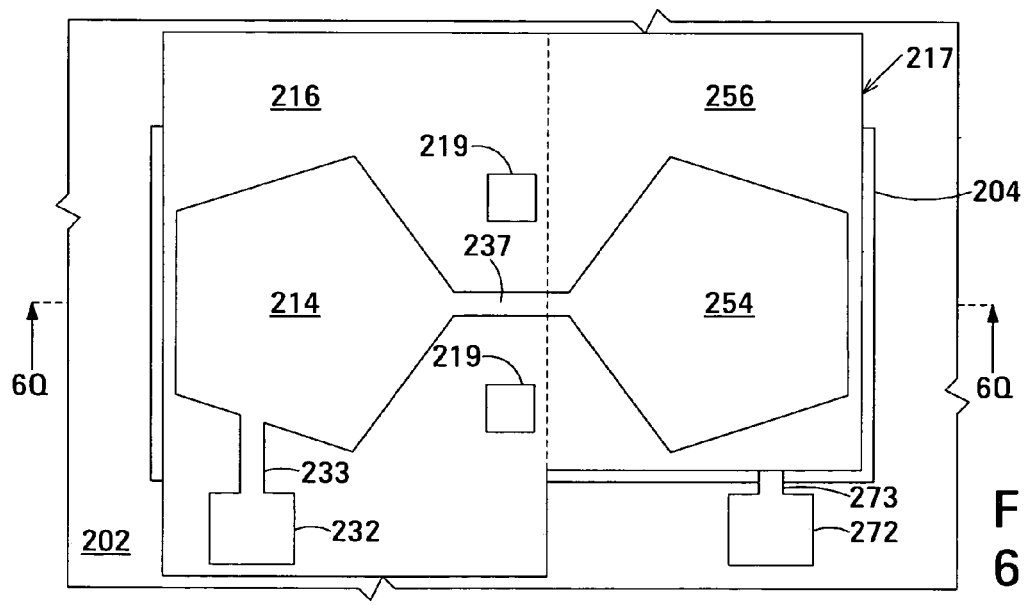
Figure 6Q:
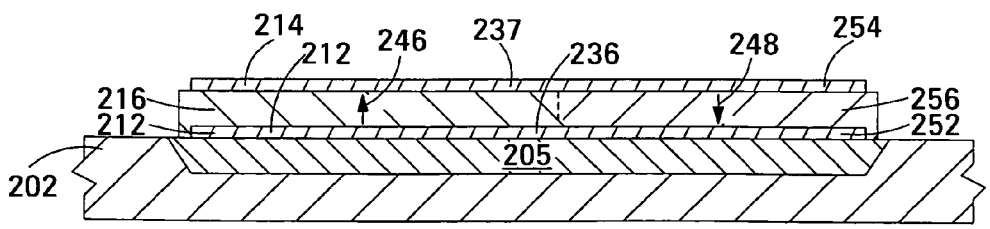

A layer of metal is deposited and is patterned to define electrode 214, electrode 254, electrical trace 237 extending between electrode 214 and electrode 254, bonding pad 232 and electrical trace 233 extending between bonding pad 232 and electrode 214, as shown in FIGS. 6F and 6Q.

In an embodiment, the metal deposited to form electrode 214, electrode 254, trace 237, bonding pad 232 and trace 233 was molybdenum. The molybdenum was deposited with a thickness of about 440 nm by sputtering, and was patterned by dry etching. Other refractory metals may alternatively be used as the material of electrodes 214 and 254, traces 233 and 237 and bonding pad 232. The electrodes, traces and bonding pad may alternatively comprise layers of more than one material.

Figure 6G:
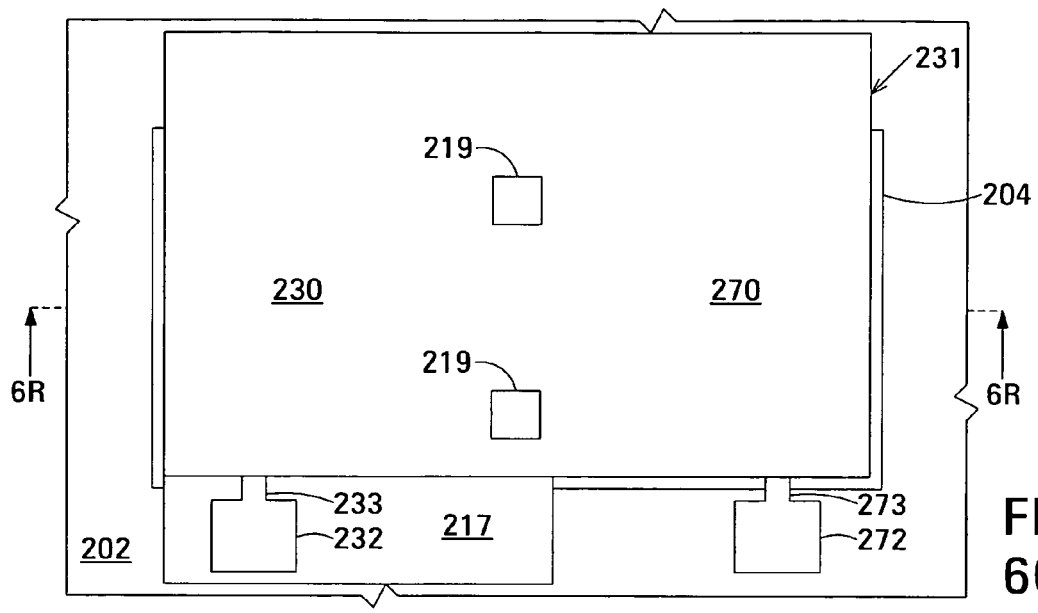
Figure 6R:
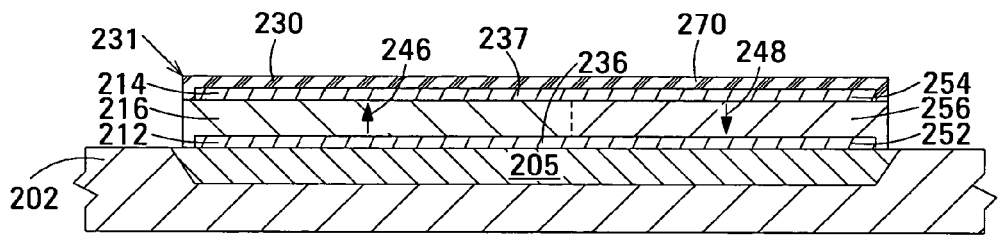

A layer of acoustic decoupling material is then deposited and is patterned to define an acoustic decoupling layer 231 that provides acoustic decoupler 230 and acoustic decoupler 270, as shown in FIGS. 6G and 6R. Acoustic decoupling layer 231 covers at least electrode 214 and electrode 254 (FIG. 6F), and is patterned to expose part of the surface of fill material 205 and bonding pads 232 and 272. Acoustic decoupling layer 231 is additionally patterned to define windows 219 that provide access to additional parts of the surface of the fill material.

In an embodiment, the acoustic decoupling material was polyimide with a thickness of about 750 nm, i.e., three quarters of a center frequency wavelength of 1.9 GHz in the polyimide. The polyimide was deposited to form acoustic decoupling layer 231 by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the material of the acoustic decoupling layer 231 was polyimide, after deposition and patterning of the polyimide, the wafer was baked at about 300° C. before further processing was performed. The bake evaporates volatile constituents of the polyimide and prevents the evaporation of such volatile constituents during subsequent processing from causing separation of subsequently-deposited layers.

Figure 6H:
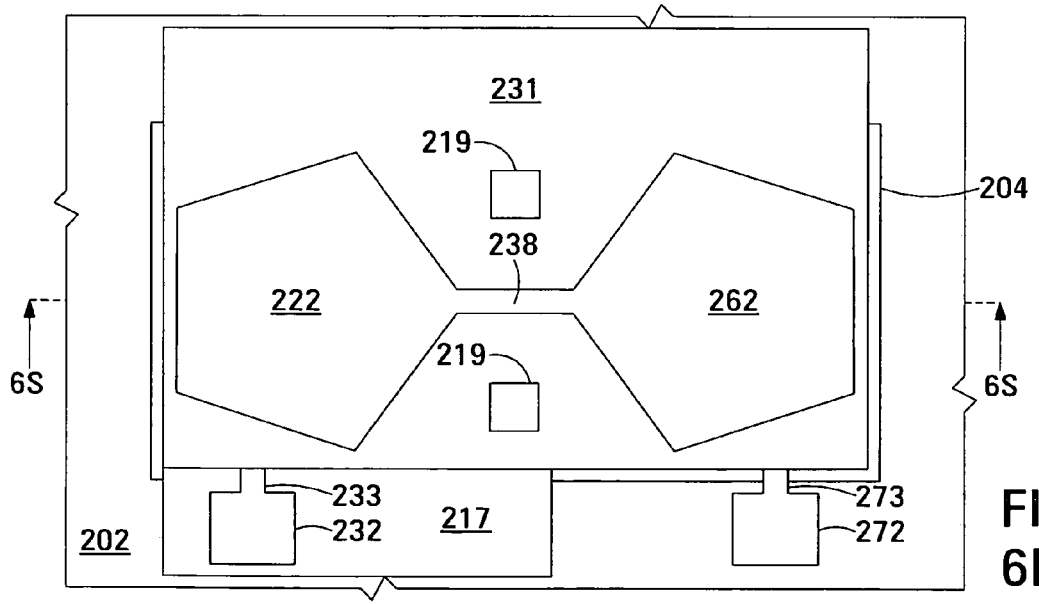
Figure 6S:
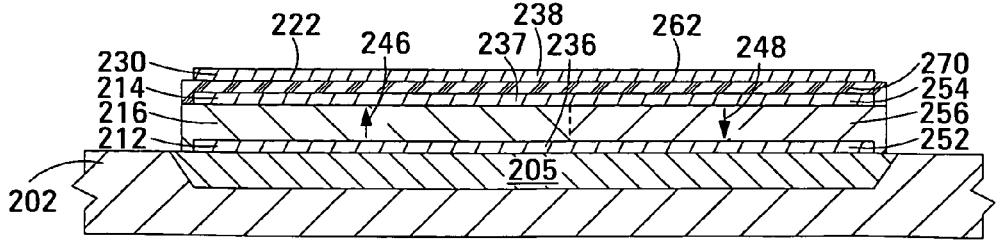

A layer of metal is deposited and is patterned to define electrode 222, electrode 262 and electrical trace 238 extending from electrode 222 to electrode 262, as shown in FIGS. 6H and 6S.

In an embodiment, the metal deposited to form electrodes 222 and 262 and electrical trace 238 was molybdenum. The molybdenum was deposited with a thickness of about 440 nm by sputtering, and was patterned by dry etching. Other refractory metals may alternatively be used as the material of electrodes 222 and 262 and electrical trace 238. The electrodes and trace may alternatively comprise layers of more than one material.

A layer of piezoelectric material is deposited and is patterned to define piezoelectric layer 227, as shown in FIG. 6I and 6T. Depositing piezoelectric layer 227 forms piezoelectric layer 226 of FBAR 220 its c-axis (indicated by arrow 247) in the normal direction and piezoelectric layer 266 of FBAR 260 with its c-axis (indicated by arrow 249) also in the normal direction. Piezoelectric layer 227 is patterned to expose bonding pads 232 and 272 and to expose part of the surface of fill material 205. Piezoelectric layer 227 is additionally patterned to define the windows 219 that provide access to additional parts of the surface of the fill material.

In an embodiment, the piezoelectric material deposited to form piezoelectric layer 227 was aluminum nitride and was deposited with a thickness of about 760 nm by sputtering in a nitrogen-rich environment. The material of piezoelectric layer therefore grows with its c-axis in the normal direction. The piezoelectric material was patterned by wet etching in potassium hydroxide or by chlorine-based dry etching. Alternative materials for piezoelectric layer 227 include zinc oxide and lead zirconium titanate.

A layer of metal is deposited and is patterned to define electrode 224, electrode 264, bonding pad 234, electrical trace 235 extending from electrode 224 to bonding pad 234, bonding pad 274 and electrical trace 275 extending from electrode 264 to bonding pad 274, as shown in FIGS. 6J and 6U.

In an embodiment, the metal deposited to form electrodes 224 and 264, bonding pads 234 and 274 and electrical traces 235 and 275 was molybdenum. The molybdenum was deposited with a thickness of about 440 nm by sputtering, and was patterned by dry etching. Other refractory metals such may alternatively be used as the material of electrodes 224 and 264, bonding pads 234 and 274 and electrical traces 235 and 275. The electrodes, bonding pads and traces may alternatively comprise layers of more than one material.

A gold protective layer (not shown) is then deposited on the exposed surfaces of bonding pads 232, 234, 272 and 274.

Figure 6K:
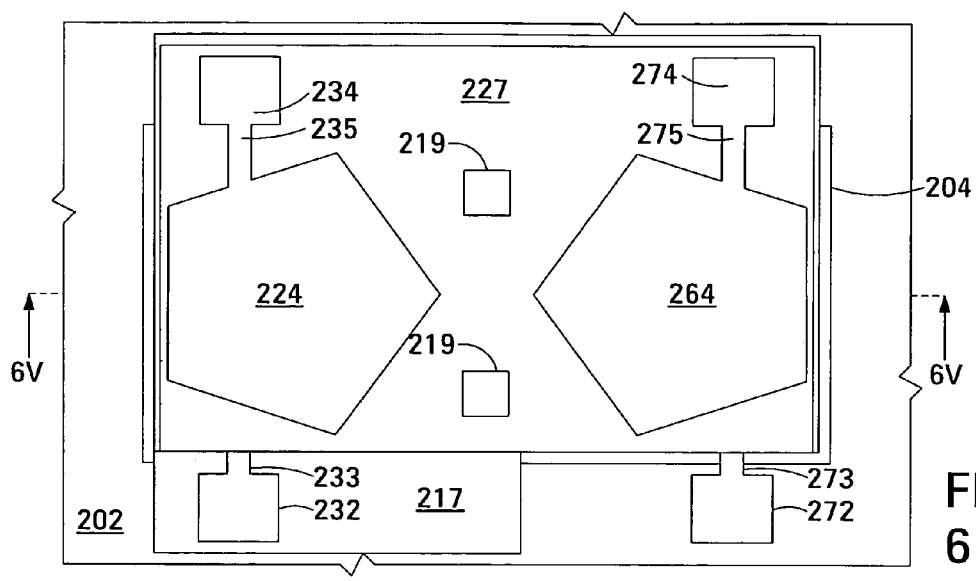
Figure 6V:
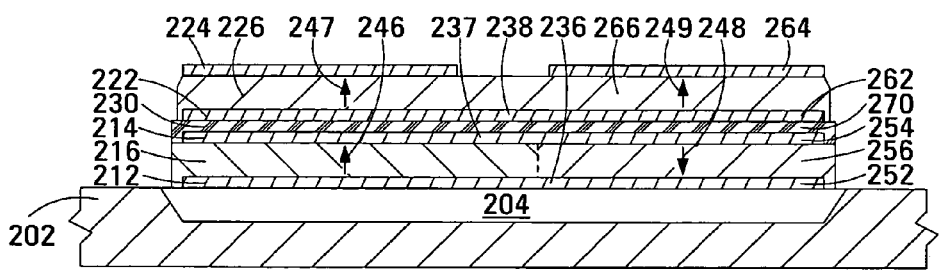

The wafer is then isotropically wet etched to remove fill material 205 from cavity 204. As noted above, portions of the surface of fill material 205 remain exposed through, for example, windows 219. The etch process leaves thin-film acoustically-coupled transformer 200 suspended over cavity 204, as shown in FIGS. 6K and 6V.

In an embodiment, the etchant used to remove fill material 205 was dilute hydrofluoric acid.

The wafer is then divided into individual transformers, including transformer 200. Each transformer is then mounted in a package and electrical connections are made between bonding pads 232, 272, 234 and 274 of the transformer and pads that are part of the package.

In use, bonding pad 272 electrically connected to electrodes 212 and 252 and bonding pad 232 electrically connected to electrodes 214 and 254 provide the first terminals of the transformer 200, and bonding pad 272 electrically connected to electrode 224 and bonding pad 274 electrically connected to electrode 254 provide the second terminals of transformer 200. In one embodiment, the first terminals provide the primary terminals and the second terminals provide the secondary terminals of thin-film acoustically-coupled transformer 200. In another embodiment, the first terminals provide the secondary terminals and the second terminals provide the primary terminals of thin-film acoustically-coupled transformer 200.

The invention has been described above with reference to an embodiment in which piezoelectric layer 256 of FBAR 250 is reverse c-axis material. However, this is not critical to the invention: the piezoelectric layer of any one of the FBARs 210, 220, 250 and 260 may alternatively be reverse c-axis material. Alternatively, the piezoelectric layer of any three of the FBARs 210, 220, 250 and 260 may be reverse c-axis material, the piezoelectric layer of the remaining one of the FBARs being normal c-axis material. Moreover, electrical circuit 241 may be configured to connect FBAR 210 in series with FBAR 250 between bonding pads 272 and 272 and electrical circuit 242 may be configured to connect FBAR 220 in parallel with FBAR 260 and to bonding pads 234 and 274.

An embodiment of thin-film acoustically-coupled transformer 200 in which acoustic decouplers 230 and 270 incorporate a Bragg structure similar to that described above with reference to FIG. 4B is made by a process similar to that described above. The process differs as follows:

After layer 217 of piezoelectric material has been deposited and patterned (FIGS. 6D, 6E, 6O and 6P), a layer of metal is deposited and is patterned in a manner similar to that shown in FIGS. 6F and 6Q to define high acoustic impedance Bragg elements incorporating electrodes 214 and 254, respectively, and additionally to define electrical trace 237 extending between the electrodes, bonding pad 232 and electrical trace 233 extending between electrode 214 and bonding pad 232. The high acoustic impedance Bragg elements are each similar to high acoustic impedance Bragg element 165 shown in FIG. 4B. The layer of metal is deposited with a nominal thickness equal to an odd, integral multiple of one quarter of the wavelength in the metal of an acoustic wave having a frequency equal to the center frequency of the pass band of transformer 200.

In an embodiment, the metal deposited to form the high acoustic impedance Bragg elements respectively incorporating electrodes 214 and 254 is molybdenum. The molybdenum is deposited with a thickness of about 820 nm (one-quarter wavelength in Mo at about 1.9 GHz) by sputtering, and is patterned by dry etching. Other refractory metals may alternatively be used as the material of the high acoustic impedance Bragg elements respectively incorporating electrodes 214 and 254. The high acoustic impedance Bragg elements may alternatively comprise layers of more than one metal.

A layer of low acoustic impedance material is then deposited and is patterned in a manner similar to that shown in FIGS. 6G and 6R to define a low acoustic impedance Bragg element. The layer of low acoustic impedance material is deposited with a nominal thickness equal to an odd, integral multiple of one quarter of the wavelength in the low acoustic impedance material of an acoustic wave having a frequency equal to the center frequency of the pass band of transformer 200. The low acoustic impedance Bragg element covers at least the high acoustic impedance Bragg elements, and is additionally patterned to expose part of the surface of fill material 205 and bonding pads 232 and 272. The layer of low acoustic impedance material is additionally patterned to define windows 219 that provide access to additional parts of the surface of the fill material.

In an embodiment, the low acoustic impedance material is $SiO_2$ with a thickness of about 790 nm. The $SiO_2$ is deposited by sputtering, and is patterned by etching. Other low acoustic impedance material that can be used as the material of low acoustic impedance Bragg element include phosphosilicate glass (PSG), titanium dioxide and magnesium fluoride. The low acoustic impedance material can alternatively be deposited by methods other than sputtering.

A layer of metal is deposited and is patterned in a manner similar to that shown in FIGS. 6H and 6S to define high acoustic impedance Bragg elements respectively incorporating electrodes 222 and 262. The layer of metal is additionally patterned to define an electrical trace 238 extending from electrode 222 to electrode 262. The layer of metal is deposited with a nominal thickness equal to an odd, integral multiple of one quarter of the wavelength in the metal of an acoustic wave having a frequency equal to the center frequency of the pass band of transformer 200.

In an embodiment, the metal deposited to form a high acoustic impedance Bragg elements respectively incorporating electrodes 222 and 262 is molybdenum. The molybdenum is deposited with a thickness of about 820 nm (one-quarter wavelength in Mo) by sputtering, and is patterned by dry etching. Other refractory metals may alternatively be used as the material of the high acoustic impedance Bragg elements respectively incorporating electrodes 222 and 262 and electrical trace 238. The high acoustic impedance Bragg elements, pads and electrical traces may alternatively comprise layers of more than one material.

Fabrication of transformer 200 is then completed using the processes described above with reference to FIGS. 6I–6K and 6T–6V.

Figure 7A:
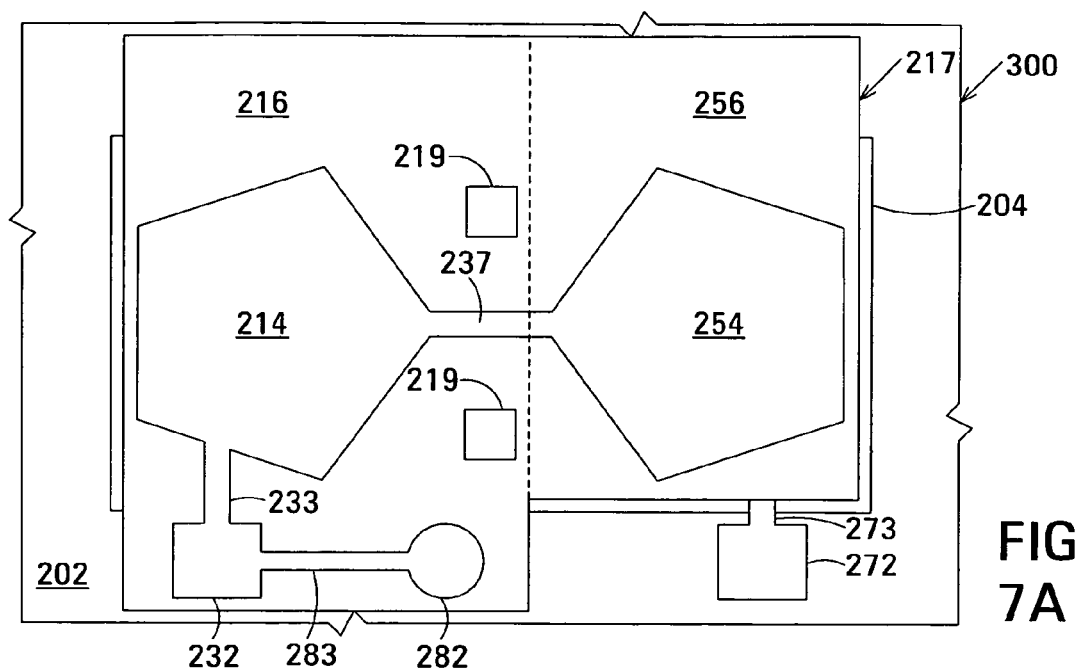
FIGS. 7A and 7B are plan views of a second embodiment of a 1:4 or 4:1 thin-film acoustically-coupled transformer in accordance with the invention at respective stages of its fabrication.
Figure 7B:
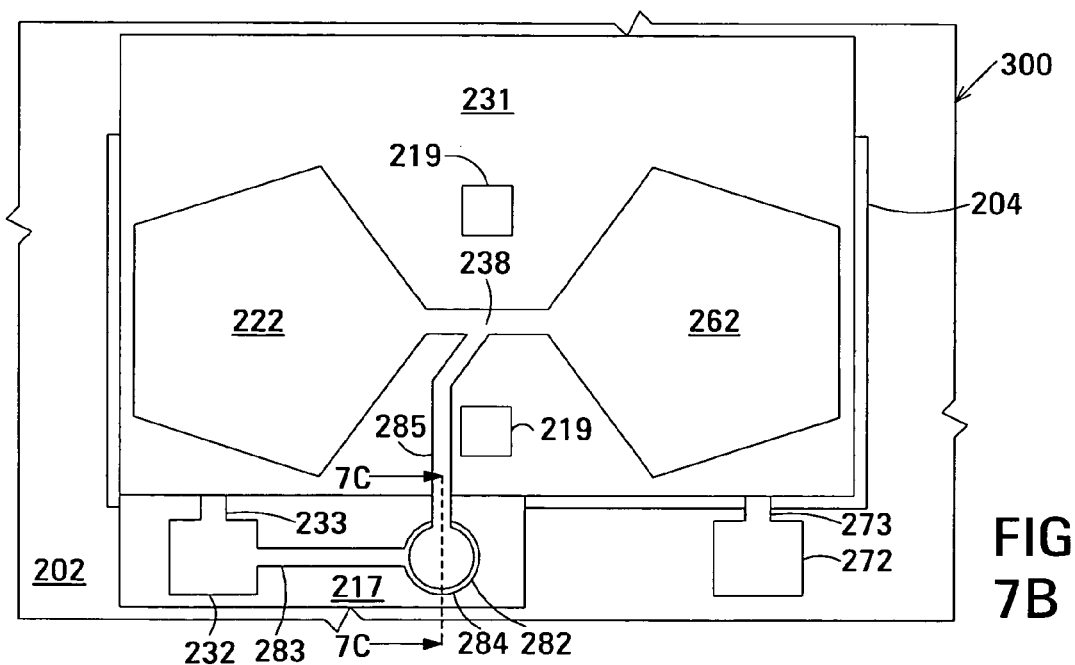

Some embodiments of an thin-film acoustically-coupled transformer in accordance with the invention incorporate an electrical connection between electrodes 214 and 222 and between electrodes 254 and 262 to hold these opposed pairs of these electrodes at the same electrical potential. This prevents the opposed pairs of electrodes from applying a voltage across the parasitic capacitor formed by acoustic decoupler 230 and electrodes 214 and 222 and the parasitic capacitor formed by acoustic decoupler 270 and electrodes 254 and 262. As noted above, electrically-conducting acoustic decouplers will provide such electrical connections. FIGS. 7A and 7B show an alternative embodiment 300 of a thin-film acoustically-coupled transformer in accordance with the invention at two different points in its fabrication. In this embodiment, the acoustic decouplers are electrically insulating. Elements of thin-film acoustically-coupled transformer 300 that correspond to elements of thin-film acoustically-coupled transformer 200 described above with reference to FIGS. 2A–2C and 3 are indicated by the same reference numerals and will not be described again in detail.

FIG. 7A shows thin-film acoustically-coupled transformer 300 at the stage of its fabrication corresponding to that described above with reference to FIGS. 6F and 6Q. After layer 217 of piezoelectric material has been deposited and patterned as described above with reference to FIGS. 6E and 6P, a metal layer is deposited and is patterned to define electrode 214, electrode 254, electrical trace 237, bonding pad 232, electrical trace 233, a connection pad 282 and an electrical trace 283 extending between connection pad 282 and bonding pad 232.

In an embodiment, the metal deposited was molybdenum with a thickness of about 440 nm. The metal was deposited by sputtering and was patterned by dry etching. Other refractory metals may alternatively be used. The electrodes, traces and pads may alternatively comprise layers of more than one material.

Figure 7C:
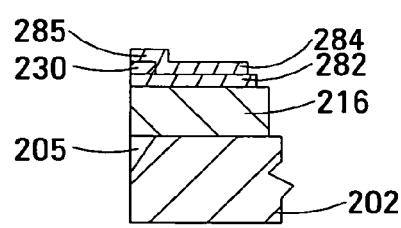
FIG. 7C is a cross-sectional view of the second embodiment along the section line 7C—7C in FIG. 7B.

FIG. 7B shows thin-film acoustically-coupled transformer 300 at the stage of its fabrication corresponding to that described above with reference to FIGS. 6H and 6S. After layer 231 of acoustic decoupling material has been deposited and patterned in a manner similar to that described above with reference to FIGS. 6G and 6R, a metal layer is deposited and is patterned to define electrode 222, electrode 262, electrical trace 238, a connection pad 284 and an electrical trace 285 extending between connection pad 284 and electrical trace 238. Connection pad 284 overlays part of, and is electrically connected to, connection pad 282 as shown in the cross-sectional view of FIG. 7C to connect electrodes 214 and 254 to electrodes 222 and 262.

In an embodiment, the metal deposited was molybdenum with a thickness of about 440 nm. The metal was deposited by sputtering, and was patterned by dry etching. Other refractory metals may alternatively be used. The electrodes, connection pad and traces may alternatively comprise layers of more than one material.

Other embodiments incorporate other arrangements that provide an electrical connection between electrode 214 and electrode 222 and between electrode 254 and electrode 262 to minimize the signal-frequency voltage applied to the parasitic capacitors of which these electrodes form part.

Fabrication of a thin-film acoustically-coupled transformer in accordance with the invention is described above with reference to an example in which a layer of reverse c-axis piezoelectric material with good piezoelectric properties is deposited under normal deposition conditions on a thin seed layer of reverse c-axis piezoelectric material deposited under deposition conditions that promote the formation of reverse c-axis material. As noted above, an entire layer of reverse c-axis material may alternatively be deposited under deposition conditions that promote the formation of reverse c-axis material.

In such a method, the processes described above with reference to FIGS. 6A, 6B, 6L and 6M are performed. Then, after a metal layer is deposited and patterned to define electrodes 212 and 252, etc., as described above with reference to FIGS. 6C and 6N, a layer of piezoelectric material is deposited under deposition conditions that promote the formation of normal c-axis material. The normal c-axis material is patterned to expose electrode 252, part of electrical trace 236 adjacent electrode 252, bonding pad 272 and electrical trace 273. The portion of the layer of normal c-axis material that remains after the patterning is covered with a suitable etch stop layer, such as a layer of molybdenum. A layer of reverse c-axis piezoelectric material is then deposited under deposition conditions that promote the formation of reverse c-axis material. The reverse c-axis material is patterned by photolithographically-defined etching to expose the normal c-axis material covering electrode 212, and additionally to expose part of the surface of fill material 205 and bonding pads 232 and 272. The patterning additionally defines windows 219 that provide access to additional parts of the surface of the fill material. The etch stop layer protects the layer of normal c-axis material during the patterning of the layer of reverse c-axis material. The etch stop layer is then removed. Fabrication of the transformer is completed by performing the processes described above with reference to FIGS. 6F–6K and 6Q–6V.

In another alternative, the processes described above with reference to FIGS. 6A, 6B, 6L and 6M are performed. Then, after a metal layer is deposited and patterned to define electrodes 212 and 252, etc., as described above with reference to FIGS. 6C and 6N, a layer of piezoelectric material is deposited under deposition conditions that promote the formation of normal c-axis material. The normal c-axis material is patterned to expose electrode 252, part of electrical trace 236 adjacent electrode 252, bonding pad 272 and electrical trace 273. A layer of photoresist or other protective material is deposited and is patterned to define a window similar in shape and extent to seed layer 255 shown in FIG. 6D. Electrode 252 and part of electrical trace 236 adjacent electrode 252 are exposed through the window. A layer of reverse c-axis piezoelectric material is then deposited under deposition conditions that promote the formation of reverse c-axis material. The layer of reverse c-axis piezoelectric material is then patterned using a lift-off process. The lift-off process removes all the reverse c-axis material deposited on the layer of photoresist but leaves reverse c-axis material deposited in the window defined in the photoresist. The photoresist is then removed. Fabrication of the transformer is completed by performing the processes described above with reference to FIGS. 6F–6K and 6Q–6V.

The normal c-axis piezoelectric material and the reverse c-axis piezoelectric material may be deposited in a reverse order to that just described.

FIGS. 8A–8F illustrate another way of making an embodiment 400 of a thin-film acoustically-coupled transformer in accordance with the invention. Elements of thin-film acoustically-coupled transformer 400 that correspond to elements of thin-film acoustically-coupled transformer 200 described above with reference to FIGS. 2A–2C and 3 are indicated by the same reference numerals and will not be described again in detail. In thin-film acoustically-coupled transformer 400, a piezoelectric ferroelectric material is used as the piezoelectric material of piezoelectric layers 217 and 227, the material of piezoelectric layer 266 is reverse c-axis material and the material of the remaining piezoelectric layers 216, 226 and 256 is normal c-axis material. Alternatively, the material of piezoelectric layer 256 may be reverse c-axis material. Piezoelectric layer 256 or 266 is made of reverse c-axis material because the directions of the c axes of the ferroelectric material constituting these layers are set by applying electric fields in opposite directions to piezoelectric layers 256 and 266, and electrodes 254 and 264 located on piezoelectric layers 256 and 266, respectively, are the only two electrodes that are not interconnected by one of electrical traces 236, 237 and 238.

FIGS. 8A–8F are plan views illustrating the processing of a wafer 402 to fabricate exemplary embodiments of thin-film acoustically-coupled transformers 400 similar to thin-film acoustically-coupled transformer 200 described above with referenced to FIGS. 2A–2C. As noted above, thousands of thin-film acoustically-coupled transformers are typically fabricated on a single wafer. However, the number of thin-film acoustically-coupled transformers shown in FIGS. 8A–8F has been reduced to four to simplify the drawing. The quantitative examples set forth below relate to embodiments of thin-film acoustically-coupled transformer 400 suitable for operation at a frequency of about 1.9 GHz. Embodiments suitable for operation at other frequencies will differ in such details.

Figure 8A:
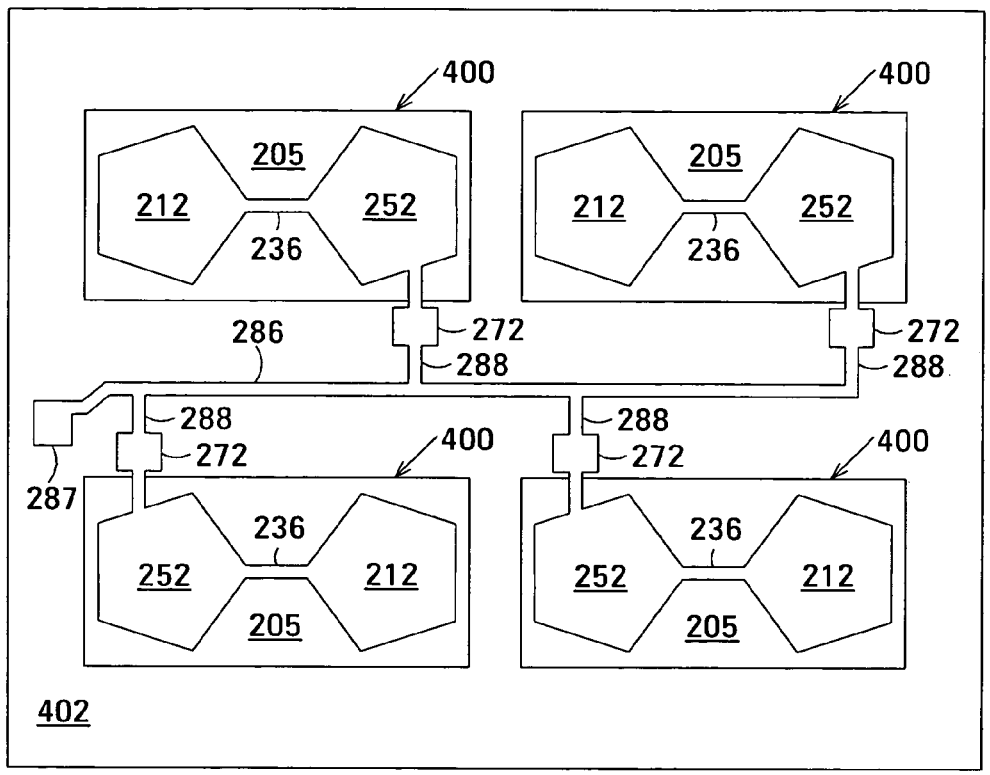
FIGS. 8A–8F are plan views illustrating another exemplary process for making a thin-film acoustically-coupled transformer in accordance with the invention.

First, the processes described above with reference to FIGS. 6A, 6B, 6L and 6M are performed. Then, a first metal layer is deposited on the wafer. In an embodiment in which the material of piezoelectric layer 417 (FIG. 8B) is a perovskite ferroelectric material such as lead zirconium titanate (PZT), the material of the first metal layer is platinum or iridium. These materials are compatible with the deposition process later used to deposit piezoelectric layer 417. Alternatively, the first metal layer is composed of a layer of a refractory metal, such as molybdenum coated with a thin protective layer of platinum or iridium. The layer of refractory metal has a thickness that differs from the design thickness of the first metal layer by the thickness of the protective layer. The protective layer provides the above-mentioned deposition process compatibility. The first metal layer is patterned to define electrodes 212 and 252, electrical trace 236, bonding pad 272 and electrical trace 273 located on fill material 205, as shown in FIG. 8A and described above with reference to FIGS. 6C and 6N. The first metal layer is additionally patterned to define a level 1 bus 286, a level 1 contact pad 287 at one end of bus 286 and electrical traces 288 that respectively extend from the bonding pads 272 of transformers 400 to bus 286.

Figure 8B:
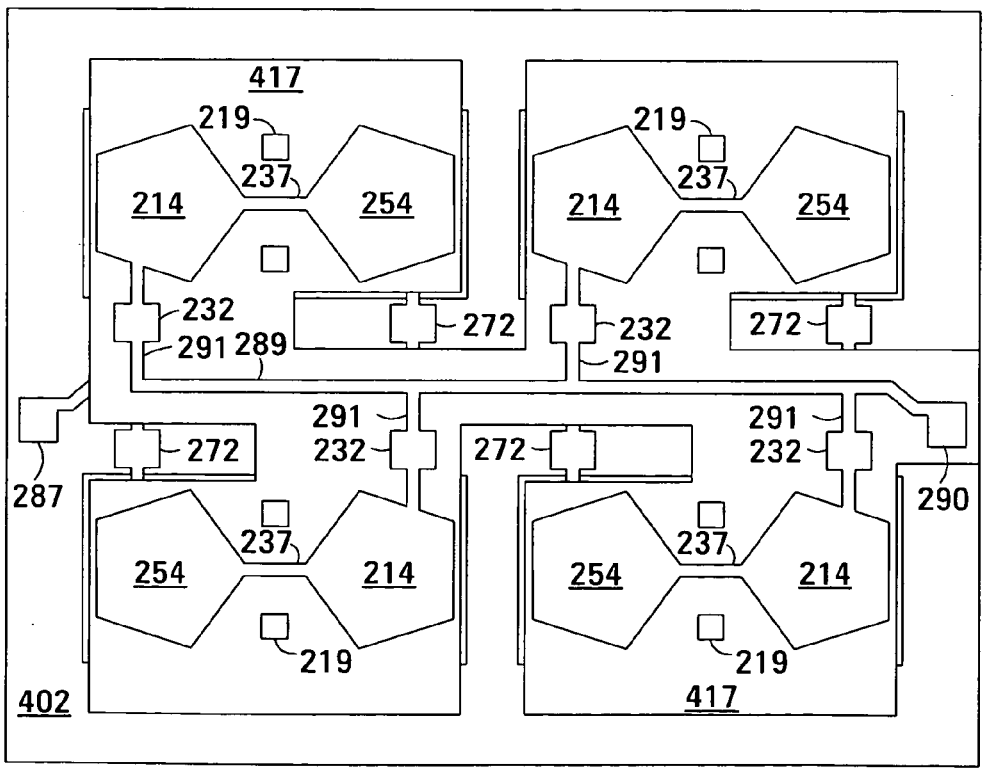

A first layer of piezoelectric material is then deposited and is patterned to define piezoelectric layer 417 shown in FIG. 8B. Piezoelectric layer 417 provides piezoelectric layers 216 and 256 (FIG. 3), and is patterned to expose part of the surface of fill material 205 and bonding pads 232 and 272. Piezoelectric layer 417 is additionally patterned to define windows 219, to cover level 1 bus 286, but to leave level 1 contact pad 287 exposed, as shown in FIG. 8B. The piezoelectric material of piezoelectric layer 417 is a ferroelectric material.

In an embodiment, the ferroelectric material deposited to form piezoelectric layer 417 was lead zirconium titanate (PZT) and was deposited with a thickness of about 500 nm by a process such as RF sputtering, sol gel or metal-organic chemical vapor deposition (MOCVD). The ferroelectric material was patterned by wet etching or chlorine-based dry etching. Alternative ferroelectric materials for piezoelectric layer 317 include perovskite ferroelectric materials such as lead meta niobate and barium titanate.

A second metal layer is deposited. In an embodiment in which the material of piezoelectric layer 427 (FIG. 8D) is a perovskite ferroelectric material such as lead zirconium titanate (PZT), the material of the second metal layer is platinum or iridium. These materials are compatible with the deposition process later used to deposit piezoelectric layer 427. Alternatively, the second metal layer is composed of a thin protective layer of platinum or iridium adjacent piezoelectric layer 417 and a layer of a refractory metal such as molybdenum. The layer of refractory metal has a thickness that differs from the design thickness of the second metal layer by the thickness of the protective layer. The protective layer provides above-mentioned deposition process compatibility. The second metal layer is patterned to define electrode 214, electrode 254, electrical trace 237, bonding pad 232 and electrical trace 233 as described above with reference to FIGS. 6F and 6Q and shown in FIG. 8B. The second metal layer is additionally patterned to define a level 2 bus 289, a level 2 contact pad 290 at one end of bus 289 and electrical traces 291 that respectively extend from the bonding pads 232 of transformers 400 to bus 289.

Figure 8C:
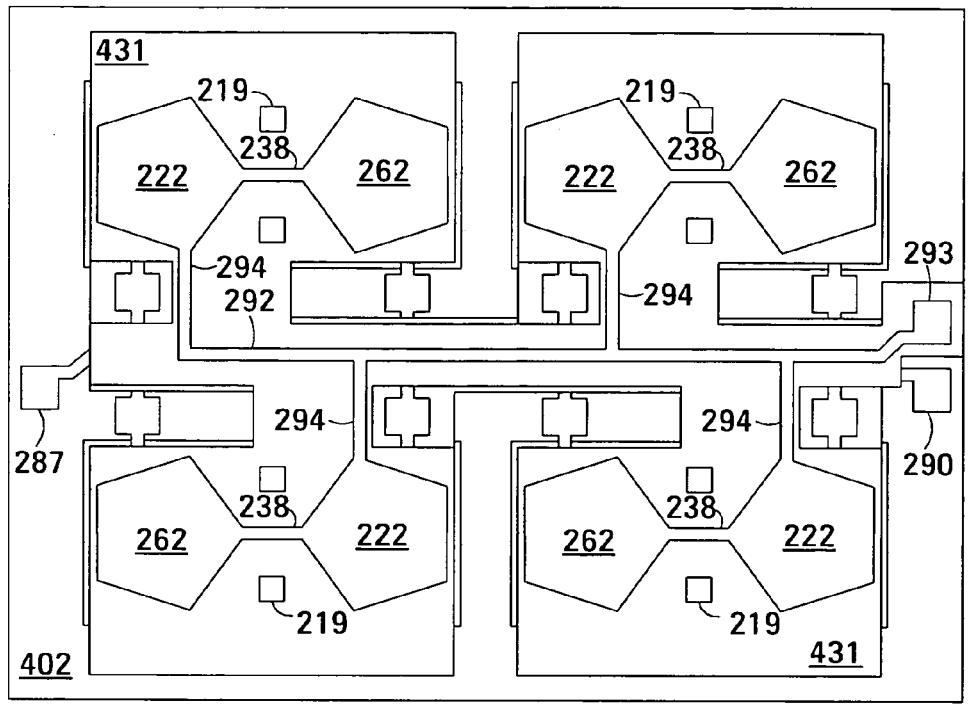

A layer of acoustic decoupling material is then deposited and is patterned to define an acoustic decoupling layer 431 that provides acoustic decoupler 230 and acoustic decoupler 270 (FIG. 3), as described above with reference to FIGS. 6G and 6R, and as shown in FIG. 8C. Acoustic decoupling layer 431 covers at least electrode 214 and electrode 254 (FIG. 8B), and is patterned to expose part of the surface of fill material 205 and bonding pads 232 and 272. Acoustic decoupling layer 431 is additionally patterned to define windows 219, to cover level 2 bus 289, but to leave contact pads 287 and 290 exposed.

A third metal layer is deposited on the wafer. In an embodiment in which the material of piezoelectric layer 427 (FIG. 8D) is a perovskite ferroelectric material such as lead zirconium titanate (PZT), the material of the third metal layer is platinum or iridium. These materials are compatible with the deposition process later used to deposit piezoelectric layer 427. Alternatively, the third metal layer is composed of a layer of a refractory metal, such as molybdenum, coated with a thin protective layer of platinum or iridium. The layer of refractory metal has a thickness that differs from the design thickness of the third metal layer by the thickness of the protective layer. The protective layer provides the above-mentioned deposition process compatibility. The third metal layer is patterned to define electrode 222, electrode 262 and electrical trace 238, as described above with reference to FIGS. 6H and 6S, and as shown in FIG. 8C. The third metal layer is additionally patterned to define a level 3 bus 292, a level 3 contact pad 293 at one end of bus 292 and electrical traces 294 that respectively extend from the electrodes 222 of transformers 400 to bus 292.

Figure 8D:
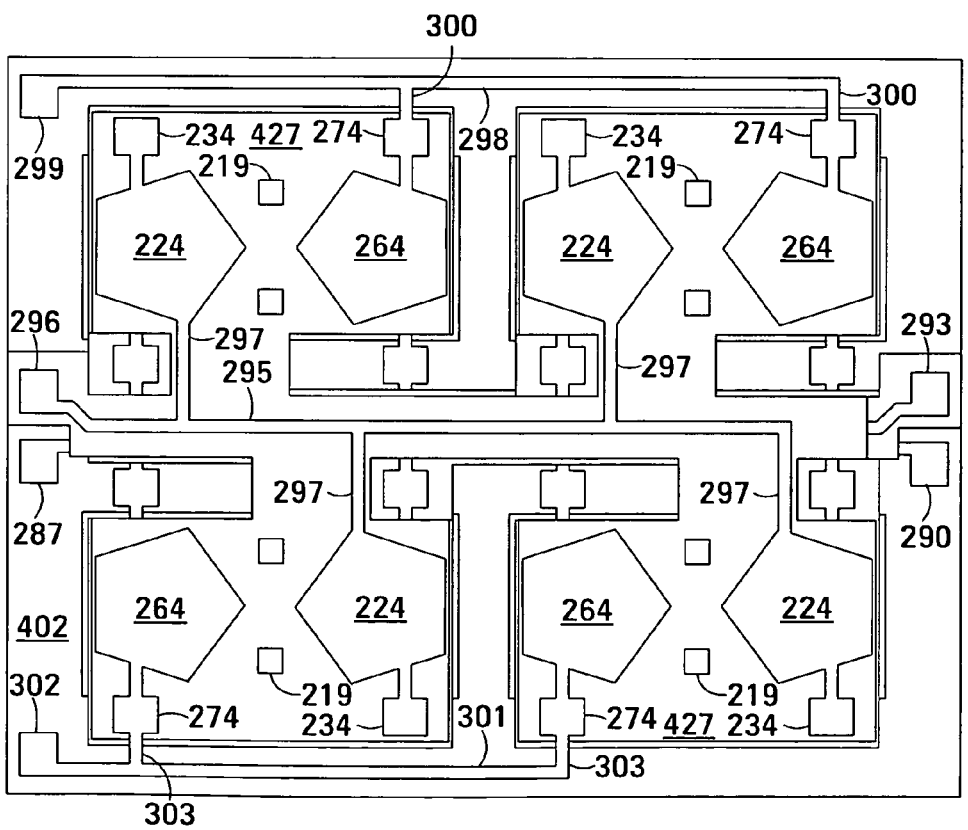

A second layer of piezoelectric material is then deposited on the wafer and is patterned to define piezoelectric layer 427 shown in FIG. 8D. Piezoelectric layer 427 provides piezoelectric layers 226 and 266 (FIG. 3), and is patterned to expose part of the surface of fill material 205 and bonding pads 232 and 272. Piezoelectric layer 427 is additionally patterned to define windows 219, to cover level 3 bus 292, but to leave contact pads 287, 290 and 293 exposed, as shown in FIG. 8D. The piezoelectric material of piezoelectric layer 427 is a ferroelectric material.

In an embodiment, the ferroelectric material deposited to form piezoelectric layer 427 was PZT and was deposited with a thickness of about 500 nm by a process such as RF sputtering, sol gel or metal-organic chemical vapor deposition (MOCVD). The ferroelectric material was patterned by wet etching or by chlorine-based dry etching. Alternative ferroelectric materials for piezoelectric layer 427 include perovskite ferroelectric materials such as lead meta niobate and barium titanate.

A fourth metal layer is deposited. The material of the fourth metal layer is a refractory metal such as molybdenum. A refractory metal can be used as the material of the fourth metal layer because no perovskite ferroelectric material deposition process is performed after the fourth metal layer is deposited. The fourth metal layer is patterned to define electrode 224, electrode 264, bonding pad 234, electrical trace 235, bonding pad 274 and electrical trace 275, as described above with reference to FIGS. 6H and 6S, and as shown in FIG. 8D. The fourth metal layer is additionally patterned to define a first level 4 bus 295, a first level 4 contact pad 296 at one end of bus 295 and electrical traces 297 that respectively extend from the electrodes 224 of transformers 400 to bus 295. The fourth metal layer is additionally patterned to define a second level 4 bus 298, a second level 4 contact pad 299 at the end of bus 298 and electrical traces 300 that respectively extend from the bonding pads 274 of two of the transformers 400 to bus 298. The fourth metal layer is additionally patterned to define a third level 4 bus 301, a third level 4 contact pad 302 at one end of bus 301 and electrical traces 303 that respectively extend from the bonding pads 274 of the remaining two of the transformers 400 to bus 301, as shown in FIG. 8D.

In an embodiment, the above-described metal layers were formed by depositing molybdenum with a thickness of about 440 nm by sputtering, and were patterned by dry etching. Alternatives similar to those described above are possible.

Figure 8E:
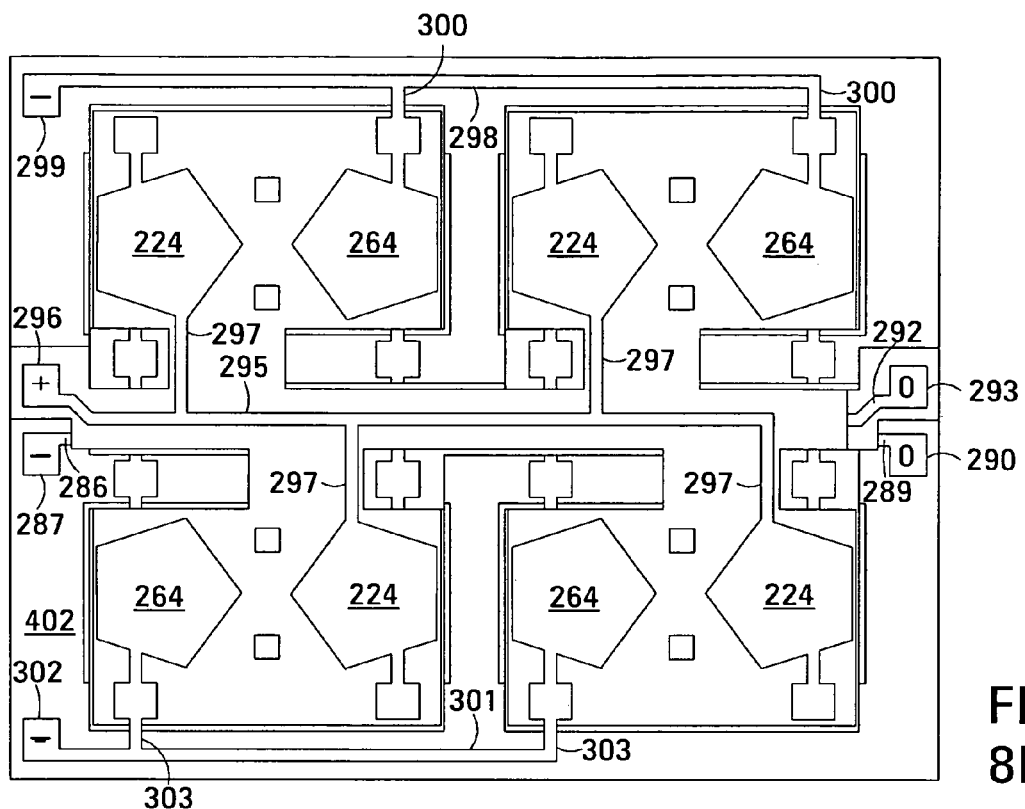

Referring now to FIG. 8E and additionally to FIGS. 8A–8C, the wafer is heated to a temperature of about 125° C. and poling voltages are applied to the contact pads as follows: contact pads 290 and 293 are grounded. Contact pads 287, 299 and 302 are connected to a negative poling voltage, and contact pad 296 is connected to a positive poling voltage. This arrangement of poling voltages is applied via busses 286, 289, 292, 295, 298 and 301 and traces 236, 288, 237, 291, 238, 294, 297, 300 and 303 to electrodes 212, 214, 222, 224, 252, 254, 262 and 264. The electrodes apply a poling electric field directed away from wafer 402 across the piezoelectric layers of FBARs 210, 220 and 250 (FIG. 3), and apply a poling electric field directed towards wafer 402 across the piezoelectric layer of FBAR 260 (FIG. 3). The poling electric fields set the c-axis of the piezoelectric layer 266 of FBAR 260 opposite in direction to the c-axes of the piezoelectric layers 216, 226 and 256 of FBARs 210, 220 and 250, respectively.

In another embodiment, poling voltages of polarities opposite those indicated are applied to the contact pads to set the c-axis of piezoelectric layer 266 opposite in direction to the c-axes of piezoelectric layers 216, 226 and 256. In another embodiment, poling voltages of polarities opposite those indicated in FIG. 8E are applied to contact pads 296, 299 and 302 to set the c-axis of piezoelectric layer 256 opposite in direction to the c-axes of piezoelectric layers 216, 226 and 266. Other combinations of poling voltages may be used to set the c-axis of one of the piezoelectric layers opposite in direction to the c-axes of the other three piezoelectric layers.

In an embodiment, the poling voltages are in the range from about 250 mV to about 1 V. With piezoelectric layers 216, 226, 256 and 266 having a thickness of about 500 nm as described above, poling voltages in this range apply a poling electric field in the range from about 500 kV/m to about 2 MV/m to the piezoelectric layers.

Figure 8F:
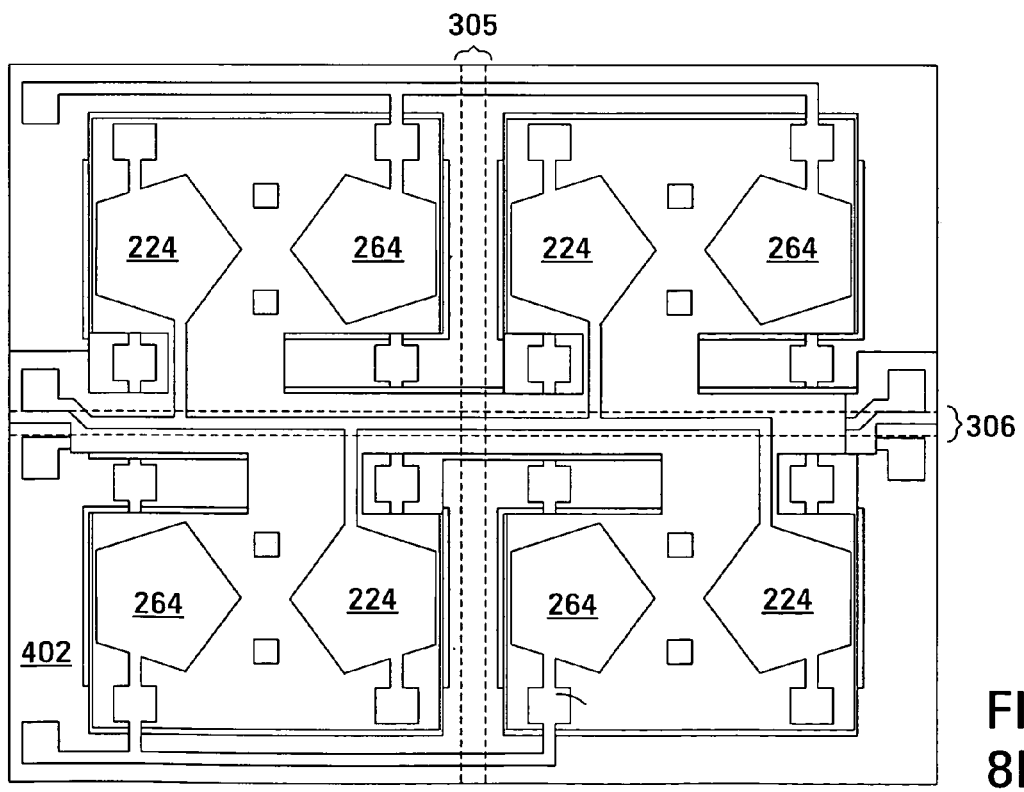

Wafer 402 is then divided into individual thin-film acoustically-coupled transformers by a known singulation process that removes the regions of wafer 402 indicated by broken lines 305 and 306 shown in FIG. 8F. The singulation process additionally separates traces 288, 291, 294, 297, 300 and 303 (FIGS. 8A–8D) from busses 286, 289, 292, 295, 298 and 301. This breaks the electrical connections between the electrodes formerly interconnected by the traces and busses.

Referring again to FIG. 3, thin-film acoustically-coupled transformers 400 fabricated by the process just described have a circuit similar to circuit 241 that connects FBARs 210 and 250 in parallel and a circuit similar to circuit 242 that connects FBARs 250 and 260 in series. However, unlike the example shown in FIG. 3, the c-axes of piezoelectric layers 216 and 256 are the same in direction and the c-axes of piezoelectric layers 226 and 266 are opposite in direction. Consequently, FBAR 210 generates acoustic energy in phase with the acoustic energy generated by FBAR 250. The electrical signal generated by FBAR 260 is in antiphase with the electrical signal generated by FBAR 220 because the direction of the c-axis of the piezoelectric layer 266 of FBAR 260 is opposite to that of the piezoelectric layer 256 of FBAR 250. The signals on electrodes 254 and 264 of thin-film acoustically-coupled transformer 400 are in antiphase, similar to the corresponding signals in thin-film acoustically-coupled transformer 200 shown in FIG. 3.

In other embodiments of a thin-film acoustically-coupled transformer in accordance with the invention in which the c-axis of the piezoelectric layer of one of the FBARs is opposite in direction to the c-axes of the piezoelectric layers of the other FBARs, electrical circuits 241 and 242 may be configured to interconnect the FBARs differently from the above-described example.

In such other embodiments, the electrical circuits 241 and 242 each electrically connect the respective FBARs in any one of a parallel, a series, an anti-parallel and an anti-series configuration. Of the sixteen possible combinations of the parallel, series, anti-parallel and anti-series electrical circuit configurations, only eight produce a working transformer. The combination of electrical circuit configurations connecting the FBARs determines the impedance and impedance transformation ratio of the transformer, i.e., 1:1 low impedance, 1:1 high impedance, 1:4 or 4:1. The single piezoelectric layer of reverse c-axis material causes an asymmetry that prevents working embodiments in which both of electrical circuits 241 and 242 are electrically balanced. In each embodiment, only one of the electrical circuits is electrically balanced. This shortcoming can be overcome by connecting the unbalanced electrical circuit to unbalanced external circuitry and vice versa. The parallel/series embodiment described in detail above additionally has good common mode rejection. The possible combinations of electrical circuit configurations are summarized in Table 1 below:

TABLE 1

|  | Parallel | Series | Anti-parallel | Anti-series |
|---|---|---|---|---|
| Parallel | X | B2 1:4 | B2 1:1 LOW | X |
| Series | B1 4:1 | X | X | B1 1:1 HI |
| Anti-parallel | B1 1:1 LOW | X | X | B1 1:4 |
| Anti-series | X | B2 1:1 HI | B2 4:1 | X |

In Table 1, the row captions indicate the configuration of one of the electrical circuits, e.g., electrical circuit 241, the column captions indicate the configuration of the other of the electrical circuits, e.g., electrical circuit 242, B1 denotes that the electrical circuit indicated by the row caption is electrically balanced, B2 denotes that the electrical circuit indicated by the column caption is balanced, and X denotes a non-functioning transformer. The impedance transformation ratio shown is the impedance transformation from electrical terminals connected to the electrical circuit indicated by the row caption to electrical terminals connected to the electrical circuit indicated by the column caption. LOW denotes that the transformer has a low impedance, equivalent to that of two FBARs in parallel; HI indicates that the transformer has a high impedance, equivalent to that of two FBARs in series. Electrodes connected in parallel or in anti-series have in-phase voltages on them whereas electrodes connected in series or in anti-parallel have antiphase voltages on them.

The electrical circuits shown in Table 1 are subject to the constraint that an electrical circuit may only connect the electrodes of FBARs at the same level as one another in SBARs 206 and 208, i.e., one of the electrical circuits may only connect the electrodes of FBARs 210 and 250 and the other of the electrical circuits may only connect the electrodes of FBARs 220 and 260.

This disclosure describes the invention in detail using illustrative embodiments. However, the invention defined by the appended claims is not limited to the precise embodiments described.

We claim:

1. An acoustically-coupled transformer, comprising:
   a first stacked bulk acoustic resonator and a second stacked bulk acoustic resonator (SBAR), each SBAR comprising:
      a stacked pair of film bulk acoustic resonators (FBARs), each of the FBARs comprising opposed planar electrodes and a layer of piezoelectric material between the electrodes, the piezoelectric material having a c-axis, and
      an acoustic decoupler between the FBARs;
   a first electrical circuit connecting one of the FBARs of the first SBAR to one of the FBARs of the second SBAR; and a second electrical circuit connecting the other of the FBARs of the first SBAR to the other of the FBARs of the second SBAR, in which the c-axis of the piezoelectric material of one of the FBARs is opposite in direction to the c-axes of the piezoelectric material of the other three FBARs.

2. The transformer of claim 1, in which:
the first electrical circuit connects the one of the FBARs of the first SBAR in parallel with the one of the FBARs of the second SBAR; and
the second electrical circuit connects the other of the FBARs of the first SBAR in series with the other of the FBARs of the second SBAR.

3. The transformer of claim 2, in which:
the transformer additionally comprises first terminals and second terminals;
the first electrical circuit additionally connects the ones of the FBARs to the first terminals; and
the second electrical circuit additionally connects the others of the FBARs to the second terminals.

4. The transformer of claim 3, in which the first terminals constitute primary terminals and the second terminals constitute secondary terminals.

5. The transformer of claim 2, in which:
the transformer additionally comprises a substrate arranged support the SBARs;
in the one of the FBARs of each the SBARs, one of the electrodes thereof is a first electrode, the other of the electrodes thereof is a second electrode, and the first electrode is closer to the substrate than the second electrode; and
the first electrical circuit comprises:
an electrical connection between the first electrode of the first SBAR and the first electrode of the second SBAR, and
an electrical connection between the second electrode of the first SBAR and the second electrode of the second SBAR.

6. The transformer of claim 1, in which the acoustic decouplers each comprise a layer of acoustic decoupling material.

7. The transformer of claim 6, in which:
the piezoelectric material has an acoustic impedance; and
the acoustic decoupling material has an acoustic impedance less than the acoustic impedance of the piezoelectric material.

8. The transformer of claim 7, in which the acoustic decoupling material has an acoustic impedance intermediate between the acoustic impedance of the piezoelectric material and the acoustic impedance of air.

9. The transformer of claim 6, in which the acoustic decoupling material has an acoustic impedance in the range from about 2 Mrayl to about 16 Mrayl.

10. The transformer of claim 6, in which the acoustic decoupling material comprises plastic.

11. The transformer of claim 6, in which the acoustic decoupling material comprises polyimide.

12. The transformer of claim 6, in which the acoustic decoupling material comprises poly(para-xylylene).

13. The transformer of claim 6, in which the acoustic decoupling material is electrically conducting.

14. The transformer of claim 6, in which:
the transformer has a pass band characterized by a center frequency; and
the layer of acoustic decoupling material has a nominal thickness equal to an odd integral multiple of one quarter of the wavelength in the acoustic decoupling material of an acoustic wave having a frequency equal to the center frequency.

15. The transformer of claim 1, in which the acoustic decouplers each comprise a Bragg structure.

16. The transformer of claim 1, additionally comprising an electrical connection between ones of the electrodes located on opposite sides of the acoustic decouplers.

17. The transformer of claim 16, in which the acoustic decouplers provide the electrical connection.

18. A method of making an acoustically-coupled transformer, the method comprising:
fabricating a first stacked bulk acoustic resonator (SBAR) and a second SBAR, the fabricating comprising:
forming lower film bulk acoustic resonators (FBARs), upper FBARs and acoustic decouplers between the lower FBARs and the upper FBARs, each of the FBARs comprising opposed planar electrodes and a layer of piezoelectric material therebetween, the piezoelectric material having a c-axis, the forming comprising setting the c-axis of the piezoelectric material of one of the FBARs opposite in direction to the c-axes of the piezoelectric material of the other three FBARs,
electrically connecting one of the FBARs of the first SBAR to one of the FBARs of the second SBAR; and
electrically connecting the other of the FBARs of the first SBAR to the other of the FBARs of the second SBAR.

19. The method of claim 18, in which:
the forming comprises:
depositing and patterning a metal layer to define a pair of the electrodes, and
depositing a layer of piezoelectric material over the electrodes; and
the setting comprises depositing a seed layer of reverse c-axis piezoelectric material on one of the electrodes prior to depositing the layer of piezoelectric material.

20. The method of claim 19, in which depositing the seed layer comprises:
depositing the seed layer on both electrodes; and
removing the seed layer from the other of the electrodes.

21. The method of claim 20, in which:
depositing the seed layer is performed under first deposition conditions that promote the formation of reverse c-axis material; and
depositing the layer of piezoelectric material is performed under second deposition conditions that promote the formation of normal c-axis material, the portion of the layer deposited on the seed layer being reverse c-axis material notwithstanding its deposition under the second deposition conditions.

22. The method of claim 21, in which the first deposition conditions comprise an oxygen-rich environment and the second deposition conditions comprise a nitrogen-rich environment.

23. The method of claim 18, in which:
the forming comprises:
depositing and patterning a metal layer to define a pair of the electrodes; and
depositing a layer of piezoelectric material on the electrodes, the layer comprising a region of reverse c-axis material on one of the electrodes and a region of normal c-axis material on the other of the electrodes; and
the setting comprises depositing the regions using different deposition conditions.

24. The method of claim 23, in which depositing the layer of piezoelectric material comprises:
depositing a first layer under first deposition conditions to form one of (a) reverse c-axis piezoelectric material and (b) normal c-axis piezoelectric material;
removing a portion of the first layer to expose one of the electrodes; and
depositing a second layer under second deposition conditions to form the other of (a) reverse c-axis piezoelectric material and (b) normal c-axis piezoelectric material; and
removing a portion of the second layer to expose the first layer.

25. The method of claim 24, in which one of the deposition conditions comprises an oxygen-rich environment and the other of the deposition conditions comprises a nitrogen-rich environment.

26. The method of claim 24, in which the removing is performed by etching.

27. The method of claim 24, in which the removing is performed by a lift-off process.

28. The method of claim 18, in which:
the forming comprises:
depositing a metal layer and patterning same to define a pair of first electrodes,
depositing a layer of ferroelectric material over the first electrodes, and
depositing an additional metal layer and patterning same to define pair of second electrodes opposite the first electrodes; and
the setting comprises applying a poling voltage of a nominal polarity between one of the first electrodes and an opposed one of the second electrodes and a poling voltage of an opposite polarity between the other of the first electrodes and the other of the second electrodes.

29. The method of claim 28, in which:
the method additionally comprises:
providing a wafer, and
fabricating an array of the transformers on the wafer; and
the applying comprises electrically interconnecting corresponding ones of the electrodes of the transformers.

30. The method of claim 29, additionally comprising singulating the wafer to separate the transformers from one another, the singulating comprising severing the interconnections between the electrodes.

31. The method of claim 18, additionally comprising electrically connecting ones of the electrodes located on opposite sides of the acoustic decouplers.

32. The method of claim 31, additionally comprising electrically connecting the ones of the electrodes using the acoustic decouplers.

* * * * *